US010454028B2

(12) United States Patent
Park

(10) Patent No.: US 10,454,028 B2
(45) Date of Patent: Oct. 22, 2019

(54) SEMICONDUCTOR DEVICES INCLUDING A PLURALITY OF STACKED CELL STRUCTURES

(71) Applicant: SAMSUNG ELECTRONICS CO., LTD., Suwon-si, Gyeonggi-do (KR)

(72) Inventor: Jong-Chul Park, Seongnam-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 84 days.

(21) Appl. No.: 15/630,087

(22) Filed: Jun. 22, 2017

(65) Prior Publication Data

US 2018/0159030 A1 Jun. 7, 2018

(30) Foreign Application Priority Data

Dec. 6, 2016 (KR) .................. 10-2016-0165222

(51) Int. Cl.
| | | |
|---|---|---|
| H01L 47/00 | (2006.01) | |
| H01L 45/00 | (2006.01) | |
| H01L 43/08 | (2006.01) | |
| H01L 27/24 | (2006.01) | |
| H01L 43/10 | (2006.01) | |

(52) U.S. Cl.
CPC ........ *H01L 45/1233* (2013.01); *H01L 27/249* (2013.01); *H01L 27/2427* (2013.01); *H01L 27/2454* (2013.01); *H01L 27/2481* (2013.01); *H01L 43/08* (2013.01); *H01L 45/04* (2013.01); *H01L 45/06* (2013.01); *H01L 45/126* (2013.01); *H01L 45/1226* (2013.01); *H01L 45/144* (2013.01); *H01L 45/146* (2013.01); *H01L 45/147* (2013.01); *H01L 43/10* (2013.01)

(58) Field of Classification Search
CPC ................................... H01L 45/1233
USPC ....................................... 257/40, 4
See application file for complete search history.

(56) References Cited

U.S. PATENT DOCUMENTS

| | | |
|---|---|---|
| 8,461,566 B2 | 6/2013 | Tang et al. |
| 8,841,649 B2 | 9/2014 | Pio |
| 9,059,395 B2 | 6/2015 | Ju et al. |
| 9,099,637 B2 | 8/2015 | Song |
| 9,136,359 B2 | 9/2015 | Song |
| 9,159,768 B2 | 10/2015 | Joo et al. |
| 9,177,613 B2 | 11/2015 | Lee et al. |
| 9,184,216 B2 | 11/2015 | Park |
| 9,184,218 B2 | 11/2015 | Zhang et al. |

(Continued)

FOREIGN PATENT DOCUMENTS

| | | |
|---|---|---|
| KR | 10-2014-0120993 A | 10/2014 |
| KR | 10-1536511 B1 | 7/2015 |
| KR | 10-2016-0046031 A | 4/2016 |

*Primary Examiner* — Caleb E Henry
(74) *Attorney, Agent, or Firm* — Lee & Morse, P.C.

(57) ABSTRACT

A semiconductor device includes a stacked structure of cell structures, an electrode structure, and a heating electrode. Each cell structure includes a capping layer, a selection layer, a buffer layer, a variable resistance layer, and a upper electrode layer sequentially stacked. The electrode structure is in an opening passing through the stacked structure, is electrically isolated from the buffer layer, the variable resistance layer, and the upper electrode layer, and is electrically connected to the selection layer. The heating electrode is between the variable resistance layer and the upper electrode layer and operates to transfer heat to the variable resistance layer.

19 Claims, 17 Drawing Sheets

(56) References Cited

U.S. PATENT DOCUMENTS

| | | | |
|---|---|---|---|
| 9,450,023 B1* | 9/2016 | Konevecki | H01L 27/2454 |
| 9,716,137 B1* | 7/2017 | Hu | H01L 27/11548 |
| 9,735,202 B1* | 8/2017 | Tanaka | H01L 45/1233 |
| 2011/0235408 A1* | 9/2011 | Minemura | H01L 27/2409 |
| | | | 365/163 |
| 2012/0147644 A1* | 6/2012 | Scheuerlein | G11C 13/0002 |
| | | | 365/51 |
| 2014/0254231 A1* | 9/2014 | Cernea | G11C 5/06 |
| | | | 365/63 |
| 2014/0361239 A1 | 12/2014 | Ramaswamy et al. | |
| 2015/0123067 A1* | 5/2015 | Lee | H01L 27/2481 |
| | | | 257/4 |
| 2015/0162383 A1 | 6/2015 | Hwang | |
| 2015/0340406 A1* | 11/2015 | Jo | H01L 45/141 |
| | | | 29/604 |
| 2016/0141337 A1* | 5/2016 | Shimabukuro | H01L 27/2481 |
| | | | 365/51 |
| 2016/0293841 A1* | 10/2016 | Ikedo | H01L 27/2481 |
| 2017/0148851 A1* | 5/2017 | Hsu | H01L 27/11514 |
| 2017/0237000 A1* | 8/2017 | Terai | H01L 45/06 |
| | | | 257/4 |
| 2017/0288138 A1* | 10/2017 | Lee | H01L 27/2409 |
| 2017/0309819 A1* | 10/2017 | Wu | H01L 45/146 |
| 2017/0352430 A1* | 12/2017 | Chen | G11C 16/0483 |
| 2018/0006219 A1* | 1/2018 | Seo | H01L 27/2427 |
| 2018/0024948 A1* | 1/2018 | Tsai | G11C 16/3454 |
| | | | 710/310 |
| 2018/0047899 A1* | 2/2018 | Horii | H01L 27/2427 |

* cited by examiner

SEMICONDUCTOR DEVICES INCLUDING A PLURALITY OF STACKED CELL STRUCTURES

CROSS-REFERENCE TO RELATED APPLICATION

Korean Patent Application No. 10-2016-0165222, filed on Dec. 6, 2016, and entitled, "Semiconductor Devices," is incorporated by reference herein in its entirety.

BACKGROUND

1. Field

One or more embodiments described herein relate to a semiconductor device.

2. Description of the Related Art

Attempts are continually being made to increase the integration of memory devices. One attempt involves the development of a variable-resistance memory device having a vertically stacked arrangement of memory cells.

SUMMARY

In accordance with one or more embodiments, a semiconductor device includes a stacked structure including a plurality of cell structures stacked on a substrate, each of the plurality of cell structures including a capping layer, a selection layer, a buffer layer, a variable resistance layer, and a upper electrode layer sequentially stacked; an electrode structure in an opening through the stacked structure, the electrode structure electrically isolated with the buffer layer, the variable resistance layer, and the upper electrode layer and electrically connected to the selection layer; and a heating electrode between the variable resistance layer and the upper electrode layer, the heat electrode to transfer heat to the variable resistance layer.

In accordance with one or more other embodiments, a semiconductor device includes a stacked structure including a plurality of cell structures stacked on a substrate, each of the plurality of cell structures including an insulation pattern and a lower electrode layer stacked; a selective pattern on a sidewall of an opening through the stacked structure; an electrode structure on the selective pattern and filling the opening; and a variable resistance layer between the lower electrode layer and the selective pattern, the variable resistance layer directly contacting the selective pattern.

In accordance with one or more other embodiments, a semiconductor device includes an electrode structure; and a plurality of cell structures in a stack, wherein each of the plurality of cell structures corresponds to a memory cell and includes a selection layer, a variable resistance layer, a heating layer, and an electrode layer, the electrode structure electrically connected to the selection layer and electrically isolated from the variable resistance layer, the heating layer, and the electrode layer, the heating layer to transfer heat to the variable resistance layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
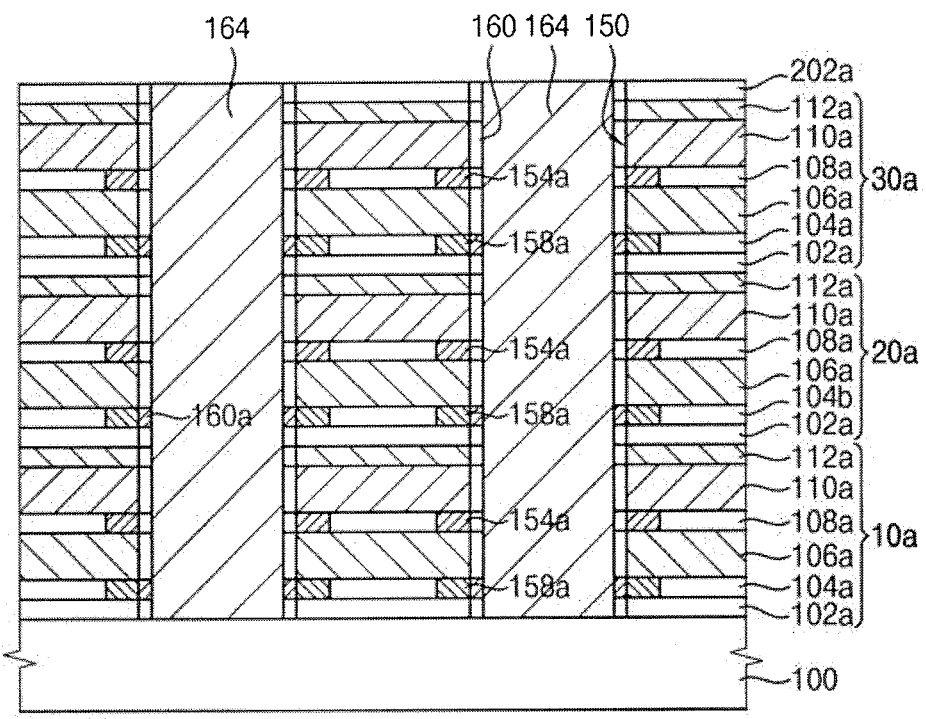
FIGS. 1 and 2 illustrate an embodiment of a variable resistance memory device.
Figure 2:
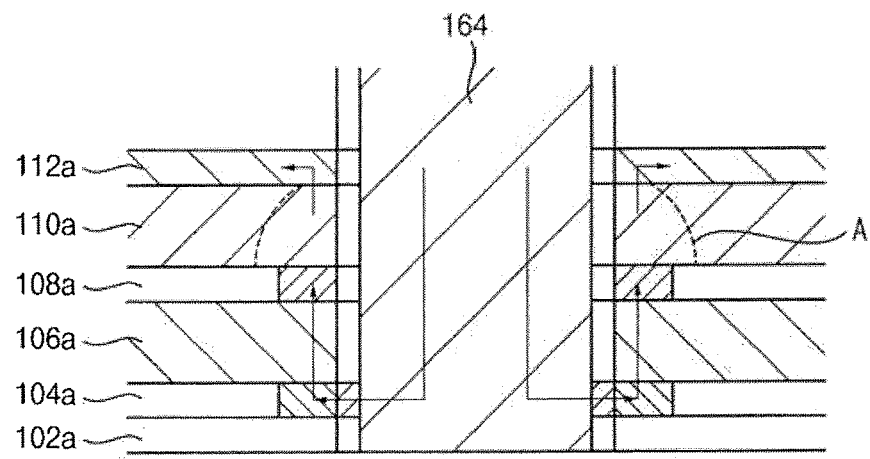
Figure 3:
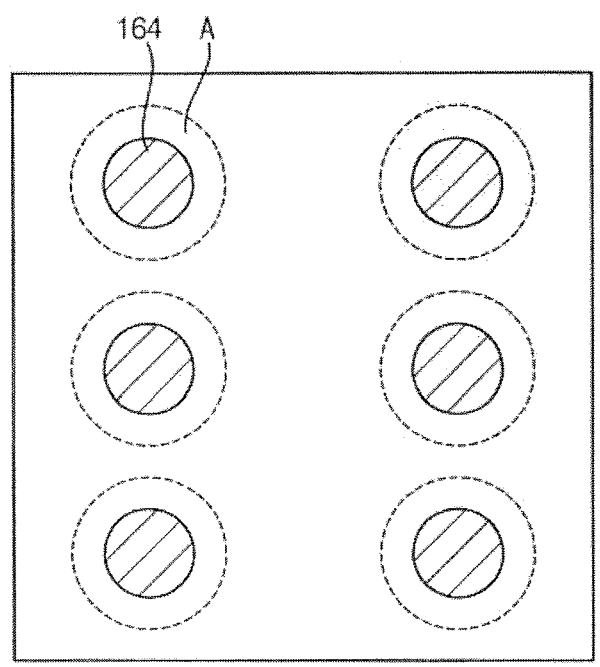
FIG. 3 illustrates a plan view of the variable resistance memory device.

FIGS. 1 and 2 are cross-sectional views illustrating an embodiment of a variable resistance memory device. FIG. 3 illustrates a plan view of the variable resistance memory device according to an example embodiment.

Referring to FIG. 1, the variable resistance memory device may include stacked cell structures 10a, 20a and 30a on a substrate 100. Each of the cell structures 10a, 20a and 30a may include a capping layer 102a, a first buffer layer 104a, a selection layer 106a, a second buffer layer 108a, a variable resistance layer 110a and an upper electrode layer 112a sequentially stacked. The cell structures 10a, 20a and 30a may be stacked in a first direction, which may be substantially perpendicular to a top surface of the substrate 100. The number of stacked cell structures 10a, 20a and 30a may vary in different embodiments. An upper capping layer 202a may be on an uppermost cell structure 30a.

The capping layer 102a may include, e.g., silicon nitride.

The first buffer layer 104a may include an insulation material having a predetermined high selectivity with respect to an insulation material of the second buffer layer 108a. Further, each of the first and second buffer layers 104a and 108a may include a material having a predetermined high selectivity with respect to the capping layer 102a. For example, the first buffer layer 104a may include silicon oxide, and the second buffer layer 108a may include polysilicon, SiC, SiOC, or another material.

The selection layer 106a may include an Ovonic threshold switch (OTS) material. The OTS material may have a variable resistance according to temperature at an amorphous state. Thus, the selection layer 106a including the OTS material may serve as a switching element. In an example embodiment, the OTS material may include germanium (Ge), silicon (Si), arsenic (As) and/or tellurium (Te). Also, the OTS material may further include selenium (Se) and/or sulfur (S).

The OTS material may include, e.g., AsTeGeSiIn, GeTe, SnTe, GeSe, SnSe, AsTeGeSiSbS, AsTeGeSiInP, AsTeGeSi, As2Te3Ge, $As_2Se_3Ge$, $As_{25}(Te_{90}Ge_{10})_{75}$, $Te_{40}As_{35}Si_{18}Ge_{6.75}In_{0.25}$, $Te_{28}As_{34.5}Ge_{15.5}S_{22}$, $Te_{39}As_{36}Si_{17}Ge_7P$, $As_{10}Te_{21}S_2Ge_{15}Se_{50}Sb_2$, $Si_5Te_{34}As_{28}Ge_{11}S_{21}Se_1$, AsTeGeSiSeNS, AsTeGeSiP, AsSe, AsGeSe, AsTeGeSe, ZnTe, GeTePb, GeSeTe, AlAsTe, SeAsGeC, SeTeGeSi, GeSbTeSe, GeBiTeSe, GeAsSbSe, GeAsBiTe, GeAsBiSe, $Ge_xSe_{1-x}$, etc.

In example embodiments, the variable resistance layer 110a may include a chalcogenide-based material having a phase that changes from an amorphous state to a crystalline state, for example, by Joule heating. For example, the variable resistance layer 110a may have a variable resistance according to a phase transition. The variable resistance memory may therefore serve as a phase-change random access memory (PRAM) device.

The chalcogenide-based material may include, for example, a GST material including germanium (Ge), antimony (Sb), and/or tellurium (Te) in a predetermined ratio. In some example embodiments, the variable resistance layer 110a may have a superlattice structure that includes a stacked structure containing GeTe—SbTe. In one embodiment, the variable resistance layer may include an In—Sb—Te (IST) material or a Bi—Sb—Te (BST) material.

In some example embodiments, the variable resistance layer 110a may include a material having a resistance that changes by a magnetic field or a spin transfer torque (STT). The variable resistance layer 110a may include a ferromagnetic material, e.g., iron (Fe), nickel (Ni), cobalt (Co), dysprosium (Dy), gadolinium (Gd), etc. The variable resistance memory device may therefore serve as a magnetic random access memory (MRAM) device.

In some example embodiments, the variable resistance layer 110a may include a perovskite material, e.g., STO ($SrTiO_3$), BTO ($BaTiO_3$), PCMO ($Pr_{1-x}Ca_xMnO_3$), etc., or a transition metal oxide, e.g., zirconium oxide ($ZrO_x$), aluminum oxide ($AlO_x$), hafnium oxide ($HfO_x$), etc. The variable resistance memory device may therefore serve as a resistive random access memory (ReRAM) device.

The upper electrode layer 112a may include a metal nitride or a metal silicon nitride. In example embodiments, the upper electrode layer 112a may include, e.g., titanium nitride ($TiN_x$), titanium silicon nitride ($TiSiN_x$), tungsten nitride ($WN_x$), tungsten silicon nitride ($WSiN_x$), tantalum nitride ($TaN_x$), tantalum silicon nitride ($TaSiN_x$), zirconium nitride ($ZrN_x$), zirconium silicon nitride ($ZrSiN_x$), titanium aluminum nitride, etc.

The upper capping layer 202a, upper electrode layer 112a, and the cell structures 10a, 20a, and 30a may include an opening 150 which exposes an upper surface of the substrate 100. A plurality of openings 150 may be spaced from each other at regular or predetermined intervals.

A second recess may be between the opening 150 and a sidewall of the first buffer layer 104a adjacent to the opening 150. A first conductive pattern 158a may be on the sidewall of the first buffer layer 104a, and may fill the second recess. An upper surface of the first conductive pattern 158a may contact a bottom of the selection layer 106a. The first conductive pattern 158a may surround the opening 150 and include a conductive material (e.g., tungsten) with an oxide.

A first recess may be between the opening 150 and a sidewall of the second buffer layer 108a adjacent to the opening 150. A heating electrode (or heating layer) 154a may be on the sidewall of the second buffer layer 108a and may fill the first recess. The heating electrode 154a may be between the selection layer 106a and the variable resistance layer 110a. The heating electrode 154a may surround the opening 150 and may transfer Joule heat to the variable resistance layer 110a. Thus, the heating electrode 154a may have a resistance greater than a resistance of the first conductive pattern 158a.

Also, an oxide of the heating electrode 154a may be an insulator. For example, the heating electrode 154a may include a metal nitride, e.g., titanium nitride, tungsten nitride, tantalum nitride, zirconium nitride, etc., or a metal silicon nitride, e.g., titanium silicon nitride, tungsten silicon nitride, tantalum silicon nitride, zirconium silicon nitride, etc. The heating electrode 154a may include carbon, e.g., C, CN, TiCN, TaCN, etc.

The capping layer 102a, the first buffer layer 104a, the selection layer 106a, the second buffer layer 108a, the variable resistance layer 110a and the upper electrode layer 112a may be sequentially stacked. This stacked structure, the first conductive pattern 158a, and the heating electrode 154a may correspond to a first structure.

Oxide layers 160 and 160a may be formed on sidewalls of the capping layer 102a, the first conductive pattern 158a, the selection layer 106a, the variable resistance layer 110a, the heating electrode 154a and the upper electrode layer 112a exposed by the opening 150. A first oxide layer 160 may be on the sidewalls of the capping layer 102a, the selection layer 106a, the variable resistance layer 110a, the upper electrode layer 112a and the heating electrode 154a, and the first oxide layer 160 may be an insulator. A second oxide layer 160a may be on the sidewall of the first conductive pattern 158a, and the second oxide layer 160a may have conductivity.

A contact plug 164 may be on the first and second oxide layers 160 and 160a and the substrate 100, and may fill the opening 150. The contact plug 164 may include a metal, e.g., tungsten, aluminum, copper, etc.

The second oxide layer 160a having conductivity may be between the contact plug 164 and first conductive pattern 158a, so that the contact plug 164, the second oxide layer 160a, and the first conductive pattern 158a may be electrically connected with each other. Also, an upper surface of the first conductive pattern 158a may contact the selection layer 106a. Thus, when an electrical signal is applied through the contact plug 164, the electrical signal may be transferred to the selection layer 106a via the second oxide layer 160a and the first conductive pattern 158a. The first conductive pattern 158a may have a ring shape surrounding the contact plug 164.

However, the first oxide layer 160, which is an insulator, may be formed between the contact plug 164 and each of sidewalls of the capping layer 102a, the selection layer 106a, the variable resistance layer 110a, the upper electrode layer 112a and the heating electrode 154a. Thus, the contact plug 164 and each of the capping layer 102a, the selection layer 106a, the variable resistance layer 110a, the upper electrode layer 112a and the heating electrode 154a may be electrically isolated with each other.

The heating electrode 154a may be electrically isolated with the contact plug 164 and may have a ring shape surrounding the contact plug 164. Thus, the variable resistance layer 110a, which is adjacent to the contact plug 164, may be selectively heated by the heating electrode 154a. The variable resistance layer 110a may be locally phase-changed, so that a resistance of a portion of the variable resistance layer 110a may be changed.

In operation, first, a selection layer 106a and a contact plug 164 in a selected cell structure may be selected. When an electrical signal is applied through the selected contact plug 164, currents may flow to the selection layer 106a via a second oxide layer 160a and/or a first conductive pattern 158a in the cell structure contacting the selected contact plug 164. Thus, currents may flow through a heating electrode 154a on the selection layer 106a, so that a portion of a variable resistance layer 110a contacting the heating electrode 154a may be heated. For example, a ring shaped portion "A" of the variable resistance layer 110a adjacent to an opening 150 may be selectively heated. In one embodiment, the resistance of the ring shaped portion "A" of the variable resistance layer 110a contacting the heating electrode 154a may be changeable. For example, the ring shaped portion "A" of the variable resistance layer 110a may be crystallized to have a predetermined low resistance. Thus, currents may flow through an upper electrode layer 112a on the variable resistance layer 110a.

As described above, memory cells may be formed in respective ones of the cell structures 10a, 20a and 30a adjacent to the contact plug 164. Thus, the variable resistance memory device may include memory cells in a vertically stacked structure to achieve high integration.

FIGS. 4 to 11 illustrate stages of an embodiment of a method for manufacturing a variable resistance memory device, which, for example, may be the variable resistance memory device in FIGS. 1 to 3.

Figure 4:
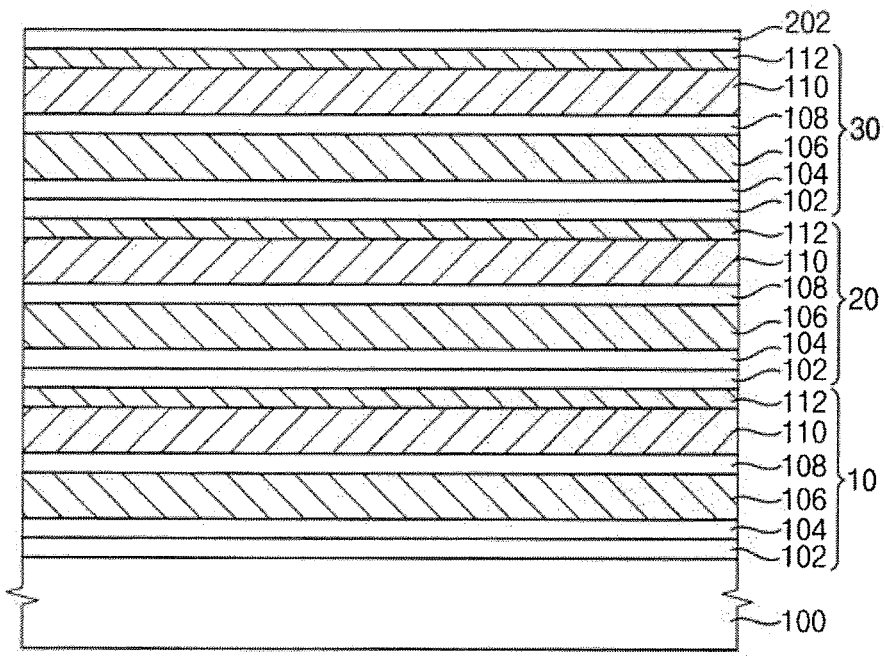
FIGS. 4 to 11 illustrate stages of an embodiment of a method for manufacturing a variable resistance memory device.

Referring to FIG. 4, a preliminary capping layer 102, a preliminary first buffer layer 104, a preliminary selection layer 106, a preliminary second buffer layer 108, a preliminary variable resistance layer 110 and a preliminary upper electrode layer 112 may be sequentially stacked on a substrate 100 to form a preliminary structure 10. The preliminary capping layer 102, the preliminary first buffer layer 104, the preliminary selection layer 106, the preliminary second buffer layer 108, the preliminary variable resistance layer 110, and the preliminary upper electrode layer 112 may be sequentially and repeatedly stacked on the preliminary structure 10 to form stacked preliminary structures 10, 20, and 30. A preliminary upper capping layer 202 may be on the uppermost preliminary structure 30. In FIG. 4, the case where the preliminary structures 10, 20, and 30 sequentially stacked at three levels are illustrated. The memory cells may be vertically stacked in a different number of levels in another embodiment, four or more levels.

The substrate 100 may be a semiconductor substrate, e.g., a silicon substrate, a germanium substrate, a silicon-germanium substrate, a silicon-on-insulator (SOI) substrate, or a germanium-on-insulator (GOI) substrate. In some example embodiments, the substrate 100 may include Group III-V compounds, e.g., GaP, GaAs, GaSb, etc.

The preliminary capping layer 102 may include, for example, silicon nitride. The preliminary first buffer layer 104 may be formed of an insulation material having a predetermined high etching selectivity with respect to an insulation material of the preliminary second buffer layer 108. The preliminary first buffer layer 104 may include, for example, silicon oxide. The preliminary second buffer layer 108 may include, for example, polysilicon, SiC, SiOC, or another material. The preliminary selection layer 106 may include, for example, an OTS material.

The preliminary variable resistance layer 110 may include a chalcogenide-based material, e.g., a GST material, an IST material, a BST material, etc. In some example embodiments, the preliminary variable resistance layer 110 may include a ferromagnetic material. In some example embodiments, the preliminary variable resistance layer 110 may include a perovskite material or a transition metal oxide. The preliminary upper electrode layer 112 may include a metal nitride or a metal silicon nitride.

Figure 5:
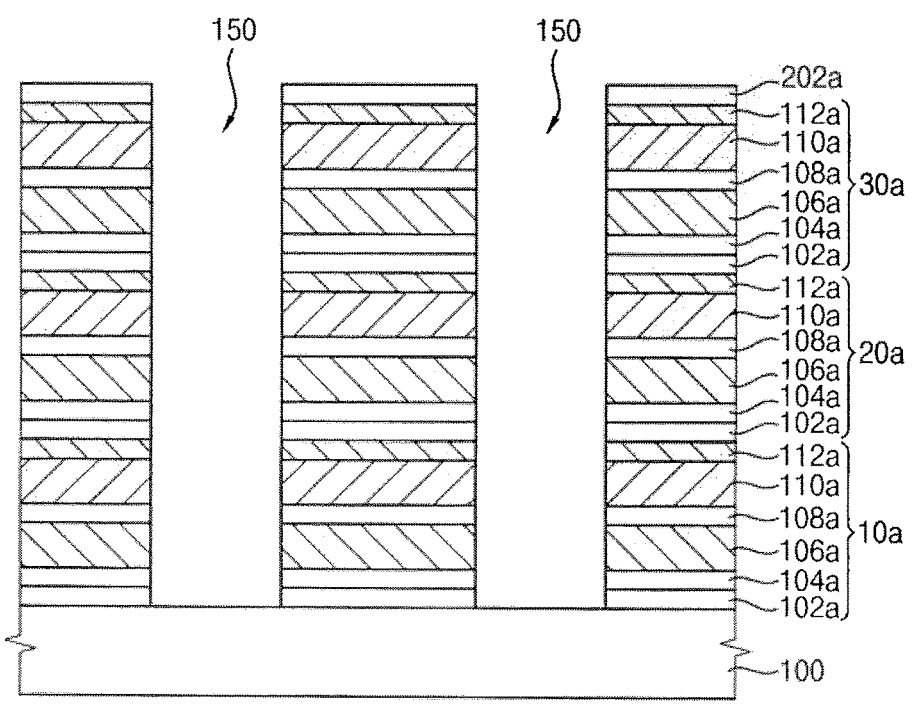

Referring to FIG. 5, the preliminary upper capping layer 202 and the stacked preliminary structures 10, 20, and 30 may be anisotropically etched to form an opening 150 therethrough. The opening 150 may expose an upper surface of the substrate 100. The etching process may be, for example, a dry etching process.

Thus, the preliminary capping layer 202, the preliminary first buffer layer 104, the preliminary selection layer 106, the preliminary second buffer layer 108, the preliminary variable resistance layer 110, and the preliminary upper electrode layer 112 may be transformed into stacked cell structures 10a, 20a, and 30a. Each of the cell structures 10a, 20a, and 30a may include a capping layer 102a, a first buffer layer 104a, a selection layer 106a, a second buffer layer 108a, a variable resistance layer 110a, and an upper electrode layer 112a sequentially stacked. An upper capping layer 202a may be on the uppermost cell structure 30a.

The capping layer 102a, the first buffer layer 104a, the selection layer 106a, the second buffer layer 108a, the variable resistance layer 110a, the upper electrode layer 112a, and the upper capping layer 202a may be exposed by a sidewall of opening 150.

Figure 6:
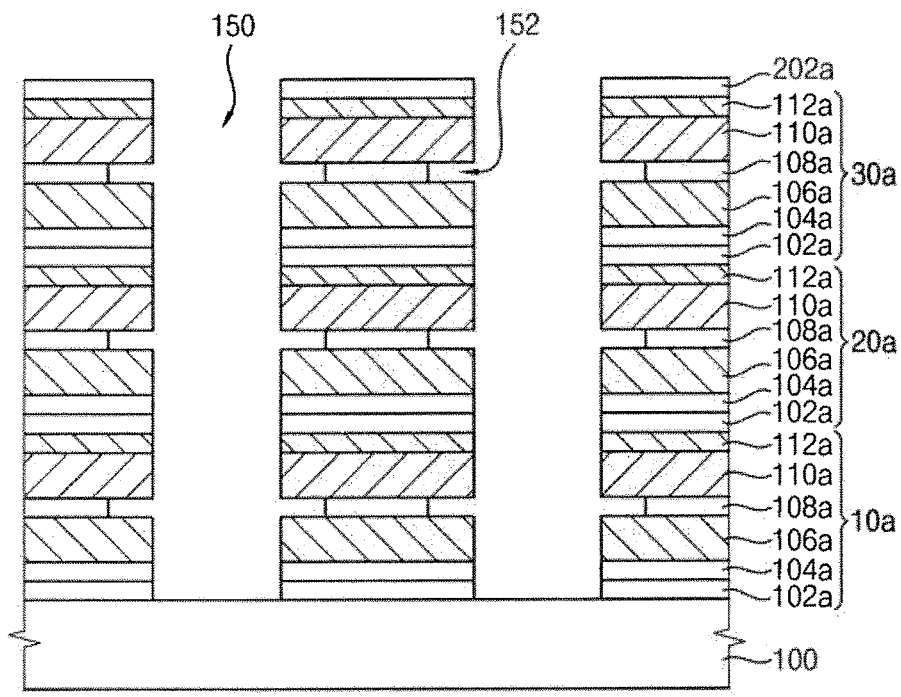

Referring to FIG. 6, the second buffer layer 108a exposed by the sidewall of the opening 150 may be partially and isotropically etched to form a first recess 152. The etching process may include, e.g., a wet etching or an isotropic dry etching process.

Figure 7:
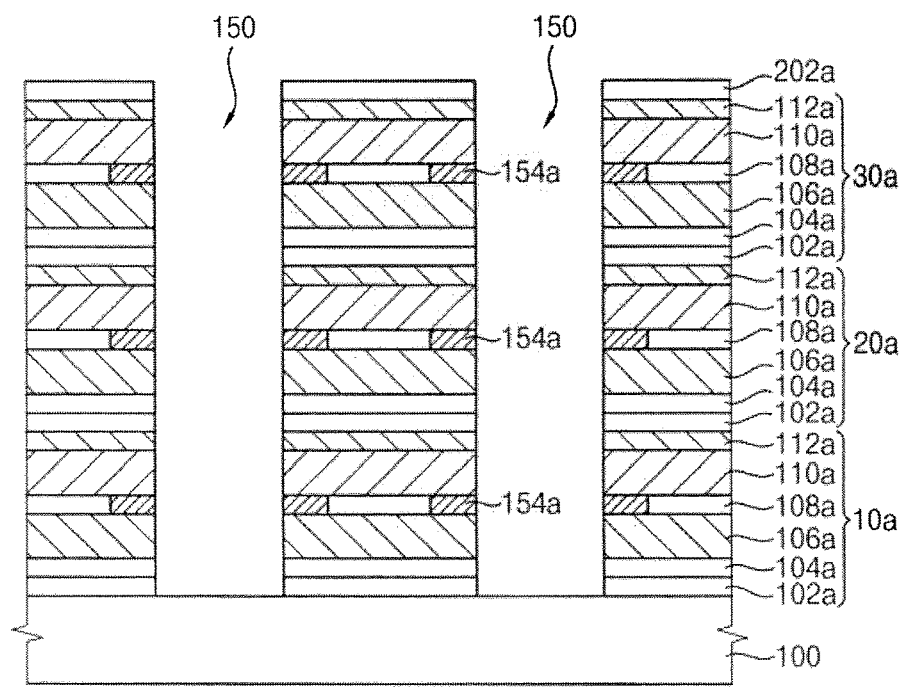

Referring to FIG. 7, a heating electrode layer may be on the upper capping layer 202a and the sidewall and a bottom of the opening 150 to fill the first recess 152. The heating electrode layer may include a metal nitride, e.g., titanium nitride (TiN$_x$), tungsten nitride (WN$_x$), tantalum nitride (TaN$_x$), zirconium nitride (ZrN$_x$), etc., or a metal silicon nitride, e.g., titanium silicon nitride (TiSiN$_x$), tungsten silicon nitride (WSiN$_x$), tantalum silicon nitride (TaSiN$_x$), zirconium silicon nitride (ZrSiN$_x$), etc. In some example embodiments, the heating electrode layer may include carbon, e.g., C, CN, TiCN, TaCN, or another material.

The heating electrode layer may be etched so that the heating electrode layer may only remain in the first recess 152 to form a heating electrode 154a. The etching process may include, e.g., a wet etching process or an isotropic dry etching process.

Figure 8:
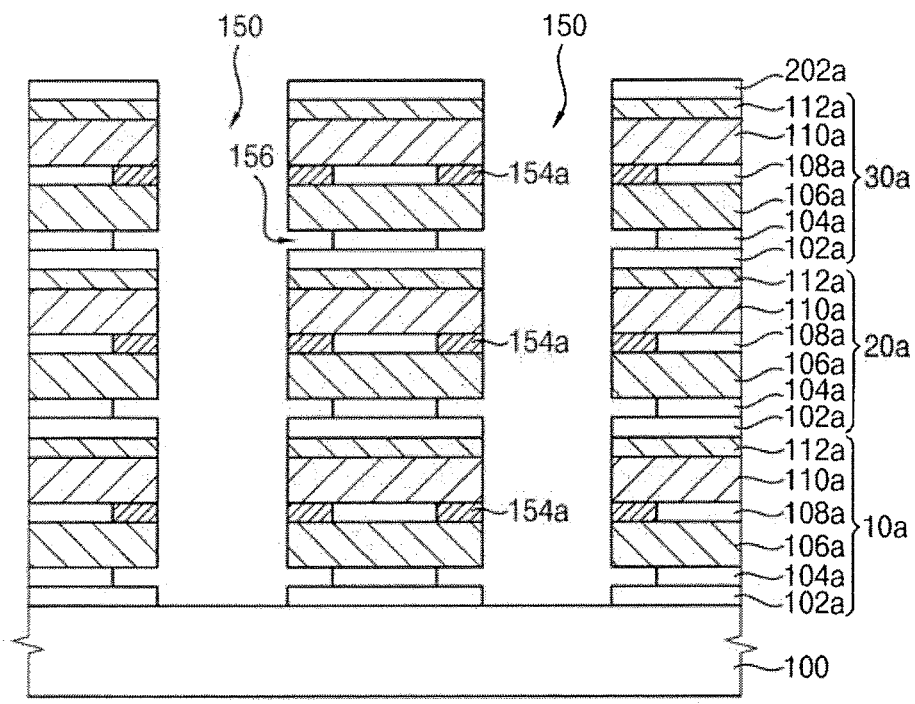

Referring to FIG. 8, the first buffer layer 104a exposed by the sidewall of the opening 150 may be partially and isotropically etched to form a second recess 156. The etching process may include, e.g., a wet etching or an isotropic dry etching process.

Figure 9:
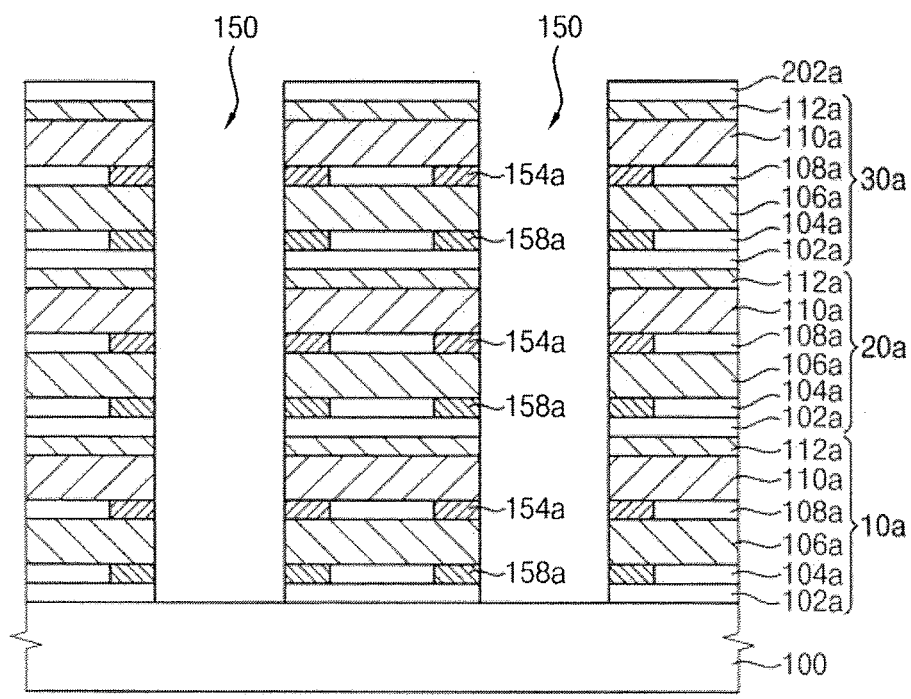

Referring to FIG. 9, a first conductive layer may be formed on the upper capping layer 202a and the sidewall and the bottom of the opening 150 to fill the second recess 156. The first conductive layer may include, e.g., tungsten.

The first conductive layer may be etched so that the first conductive layer may only remain in the second recess 156 to form a first conductive pattern 158a. The etching process may include, e.g., a wet etching process or an isotropic dry etching process.

Thus, the capping layer 102a, the first conductive pattern 158a, the selection layer 106a, the heating electrode 154a, the variable resistance layer 110a, the upper electrode layer 112a, and the upper capping layer 202a may be exposed by the sidewall of the opening 150.

Figure 10:
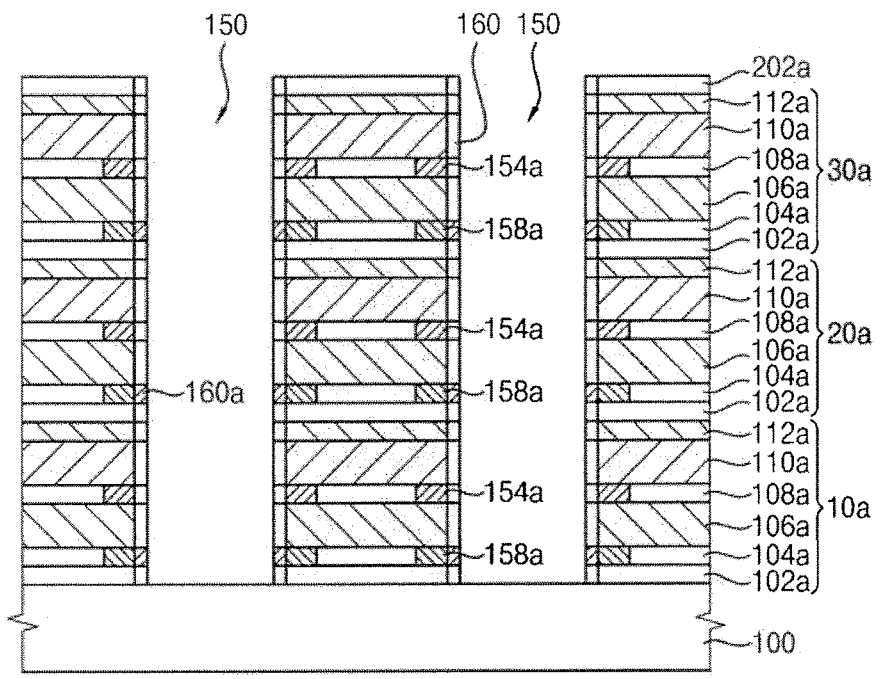

Referring to FIG. 10, the capping layer 102a, the first conductive pattern 158a, the selection layer 106a, the heating electrode 154a, the variable resistance layer 110a, the upper electrode 112a, and the upper capping layer 202a exposed by the sidewall of the opening 150 may be oxidized to form oxide layers 160 and 160a on the sidewall of the opening 150. The oxidation process may include, e.g., a plasma oxidation process or a thermal oxidation process.

In the oxidation process, a first oxide layer 160, which may be an insulator, may be formed on the sidewalls of the capping layer 102a, the selection layer 106a, the variable resistance layer 110a, the heating electrode, 154a, the upper electrode layer 112a, and the upper capping layer 202a, and a second oxide layer 160a having conductivity may be formed on the sidewall of the first conductive pattern 158a. In the oxidation process, an oxide layer may be formed on the substrate 100. Thus, after the oxidation process, the oxide layer on the substrate 100 may be selectively removed.

Figure 11:
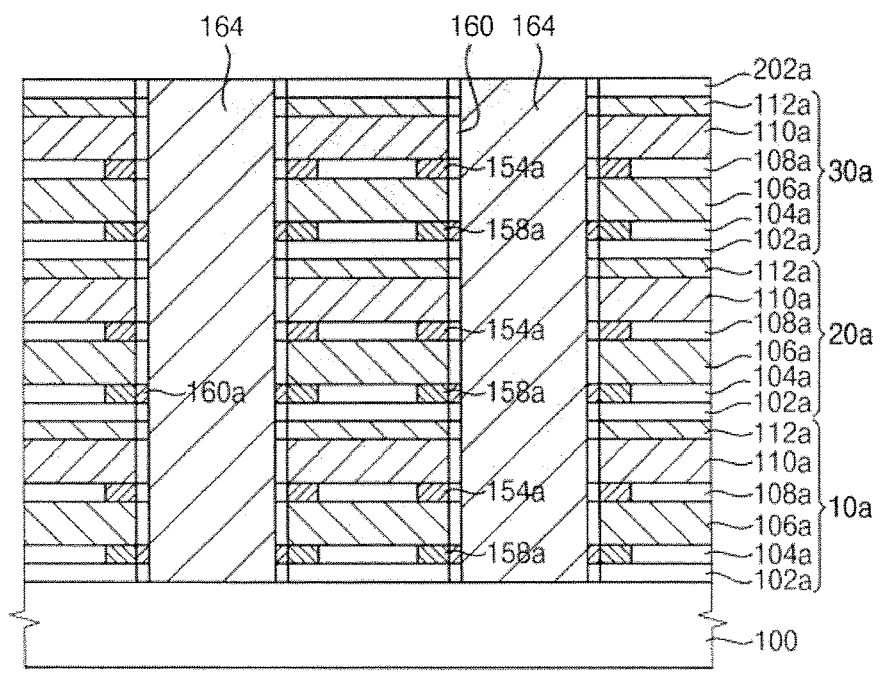

Referring to FIG. 11, a conductive layer may be formed on the first and second oxide layers 160 and 160a, the substrate 100, and the upper capping layer 202a to fill the opening 150. The conductive layer may be planarized until an upper surface of the upper capping layer 202a may be exposed. Thus, a contact plug 164 may be formed on the first and second oxide layers 160 and 160a and substrate 100 to fill the opening 150.

The conductive layer may include a metal, e.g., tungsten, aluminum, copper, etc. The conductive layer may be planarized, for example, by a chemical mechanical polishing (CMP) process or an etch back process.

Figure 12:
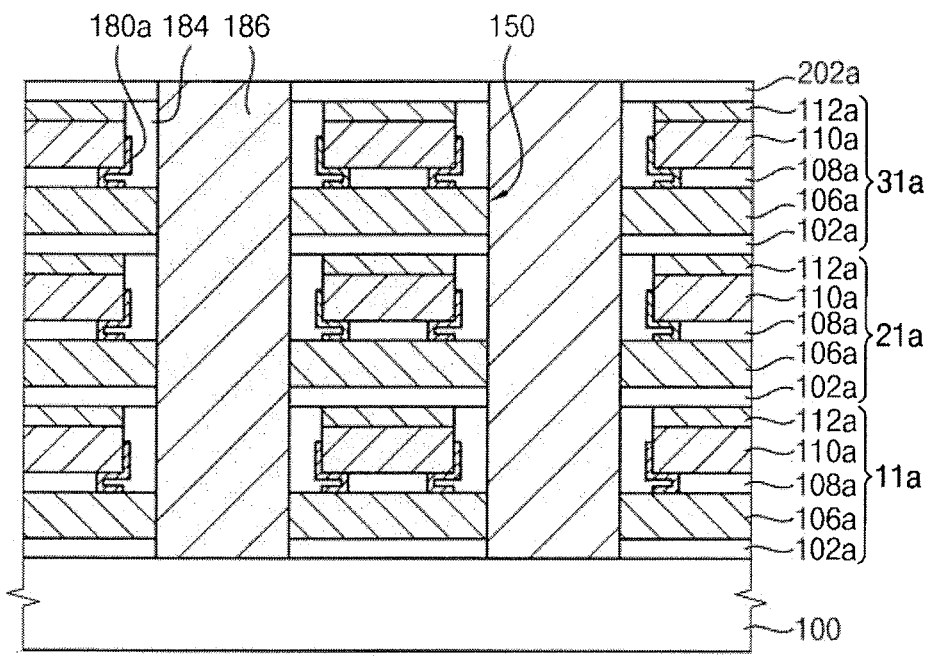
FIGS. 12 and 13 illustrate another embodiment of a variable resistance memory device.
Figure 13:
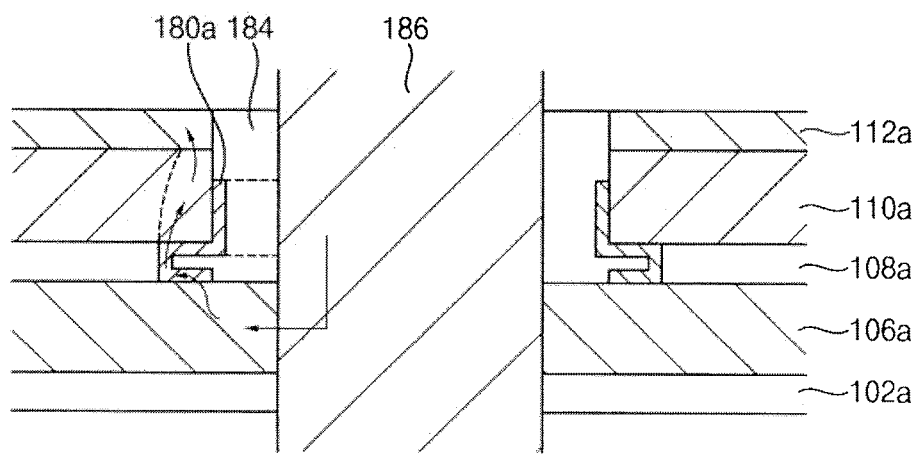

FIGS. 12 and 13 illustrate cross-sectional views of another embodiment of a variable resistance memory device. Referring to FIGS. 12 and 13, the variable resistance memory device may include stacked cell structures 11a, 21a, and 31a on the substrate 100. Each of the cell structures 11a, 21a and 31a may include the capping layer 102a, the selection layer 106a, the second buffer layer 108a, the variable resistance layer 110a, and the upper electrode layer 112a sequentially stacked. The cell structures 11a, 21a and 31a may be repeatedly stacked in the first direction. The upper capping layer 202a may be formed on the uppermost cell structure 31a.

The capping layer 102a may include, e.g., silicon nitride.

The selection layer 106a may include an OTS material.

The second buffer layer 108a may include an insulation material having a predetermined high selectivity with respect to the capping layer 102a. For example, the second buffer layer 108a may include silicon oxide. In some example embodiments, the second buffer layer 108a may include, e.g., polysilicon, SiC, SiCN, or another material.

The variable resistance layer 110a and the upper electrode layer 112a may include materials which are substantially the same as materials of the variable resistance layer and the upper electrode layer, respectively, in FIGS. 1 and 3.

The upper capping layer 202a and the stacked cell structures 11a, 21a and 31a may include the opening 150 therethrough. The opening 150 may expose an upper surface of the substrate 100. A plurality of openings 150 may be spaced apart from each other at regular or predetermined intervals.

A first recess may be formed between the opening 150 and a sidewall of the second buffer layer 108a adjacent to the opening 150. A second recess may be formed between the opening 150 and a sidewall of the variable resistance layer 110a adjacent to the opening 150. A third recess may be formed between the opening 150 and a sidewall of the upper electrode layer 112a adjacent to the opening 150.

The first recess may have a first width in a horizontal direction. The second recess may have a second width in the horizontal direction less than the first width. Thus, a lower surface of the variable resistance layer 110a, a sidewall of the second buffer layer 108a, and an upper surface of the selection layer 106a may be exposed by the first recess. The third recess may have a third width in the horizontal direction equal to or less than the second width.

A heating electrode 180a may be positioned at least in the first recess and may be conformally formed on the lower surface of the variable resistance layer 110a, the sidewall of the buffer layer 108a, and the upper surface of the selection layer 106a exposed by the first recess. For example, the heating electrode 180a may be between the selection layer 106a and the variable resistance layer 110a. Thus, the selection layer 106a and the variable resistance layer 110a may be connected with each other by the heating electrode 180a. However, the heating electrode 180a may not contact the upper electrode layer 112a.

The heating electrode 180a may include a material substantially the same as the material of the heating electrode in FIGS. 1 and 3.

An insulation pattern 184 may be on the heating electrode 180a and may fill the first, second, and third recesses. The insulation pattern 184 may include, e.g., silicon oxide. For example, the capping layer 102a, the selection layer 106a, and the insulation pattern 184 may be exposed by the sidewall of the opening 150.

A stacked structure may include the capping layer 102a, the selection layer 106a, the buffer layer 108a, the variable resistance layer 110a, and the upper electrode layer 112a. The stacked structure and heating electrode 180a may form a first structure.

A contact plug 186 may be formed on the capping layer 102a, the selection layer 106a, the insulation pattern 184 and the substrate 100, and may sufficiently fill the opening 150. The contact plug 186 may include a metal, e.g., tungsten, aluminum, copper, or another material.

The contact plug 186 may directly contact the sidewall of the selection layer 106a. However, the insulation pattern 184 may be formed between the contact plug 186 and each of the sidewalls of the heating electrode 180a, the variable resistance layer 110a, and the upper electrode 112a. Thus, each of the heating electrode 180a, the variable resistance layer 110a, and the upper electrode 112a may be electrically isolated with the contact plug 186.

The heating electrode 180a may be isolated with the contact plug 186 and may have a ring shape surrounding the contact plug 186. For example, the variable resistance layer 110a adjacent to the contact plug 186 may be selectively heated through the heating electrode 180a. The variable resistance layer 110a may be locally phase-changed, in order to change a resistance of a portion of variable resistance layer 110a.

In operation, first, a selection layer 106a and a contact plug 164 in a selective cell structure may be selected. When an electrical signal is applied through a selected contact plug 186, currents may flow to the selection layer 106a in the selective cell structure contacting the selected contact plug 186. Thus, currents may flow through a heating electrode 180a on the selection layer 106a, in order to heat a portion of a variable resistance layer 110a contacting the heating electrode 180a. Thus, currents may flow through an upper electrode layer 112a on the variable resistance layer 110a.

As described above, memory cells may be formed at respective cell structures adjacent to the contact plug 186. The variable resistance memory device may therefore have a vertically stacked arrangement of memory cells to achieve high integration.

FIGS. 14 to 19 illustrate stages of another embodiment of a method for manufacturing the variable resistance memory device, e.g., the variable resistance memory device in FIGS. 12 to 13.

Figure 14:
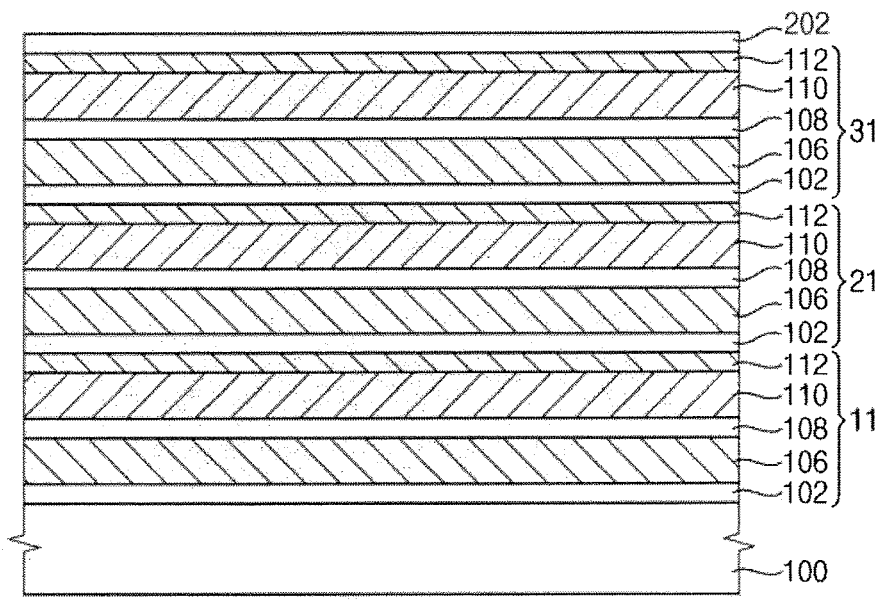
FIGS. 14 to 19 illustrate stages of another embodiment of a method for manufacturing a variable resistance memory device.

Referring to FIG. 14, the preliminary capping layer 102, the preliminary selection layer 106, the preliminary second buffer layer 108, the preliminary variable resistance layer 110, and the preliminary upper electrode layer 112 may be sequentially stacked on the substrate 100 to form a preliminary structure 11. The preliminary capping layer 102, the preliminary selection layer 106, the preliminary second buffer layer 108, the preliminary variable resistance layer 110, and the preliminary upper electrode layer 112 may be sequentially and repeatedly stacked on the preliminary structure 11 to form stacked preliminary structures 11, 21, and 31. The preliminary upper capping layer 202 may be formed on the uppermost preliminary structure 31.

The preliminary capping layer 102, the preliminary selection layer 106, the preliminary second buffer layer 108, the preliminary variable resistance layer 110, the preliminary upper electrode layer 112, and the preliminary upper capping layer 202 may include, for examples, materials substantially the same as materials of the preliminary capping layer, the preliminary selection layer, the preliminary buffer layer, the preliminary variable resistance layer, the preliminary upper electrode layer, and the preliminary upper capping layer, respectively, in FIG. 4.

Figure 15:
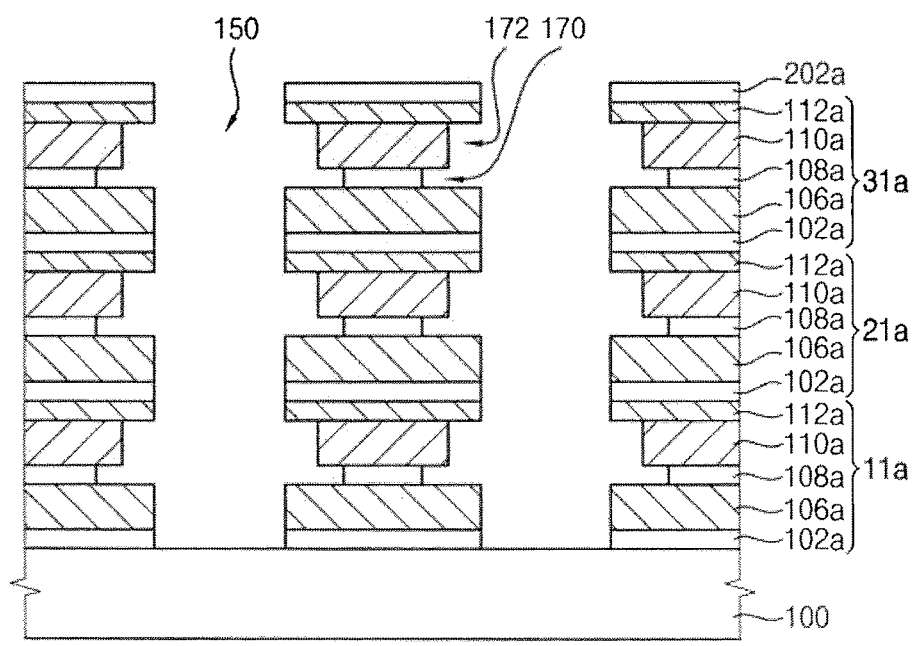

Referring to FIG. 15, the preliminary upper capping layer 202 and the stacked preliminary structures 11, 21, and 31 may be anisotropically etched to form an opening 150 therethrough. The opening 150 may expose an upper surface of the substrate 100. The etching process may include, for example, a dry etching process.

The preliminary second buffer layer 108 and the preliminary variable resistance layer 110 exposed by a sidewall of the opening 150 may be partially and isotropically etched to form a first recess 170 and a second recess 172. The first recess 170 may be formed by partially etching the preliminary second buffer layer 108. The second recess 172 may be formed by partially etching the preliminary variable resistance layer 110. In example embodiments, the preliminary second buffer layer 108 may be etched more quickly than the preliminary variable resistance layer 110 during the isotropic etching process. In some example embodiments, the first recess 170 and the second recess 172 may be formed by different isotropic etching processes. Thus, the first recess 170 may have a first width in the horizontal direction, and the second recess 172 may have a second width in the horizontal direction less than the first width. The isotropic etching process of the preliminary second buffer layer 108 and preliminary variable resistance layer 110 may include, e.g., a wet etching process or an isotropic dry etching process.

Thus, the preliminary capping layer 102, the preliminary selection layer 106, the preliminary second buffer layer 108, the preliminary variable resistance layer 110, and the preliminary upper electrode layer 112 may be transformed into a capping layer 102a, a selection layer 106a, a second buffer layer 108a, a variable resistance layer 110a, and an upper electrode layer 112a, respectively, including the opening 150 and the first and second recesses 170 and 172. An upper surface of the selection layer 106a, a sidewall of the second buffer layer 108a, and a bottom of the variable resistance layer 110a may be exposed by the first recess 170. A sidewall of the variable resistance layer 110a and a bottom of the upper electrode layer 112a may be exposed by the second recess 172.

Figure 16:
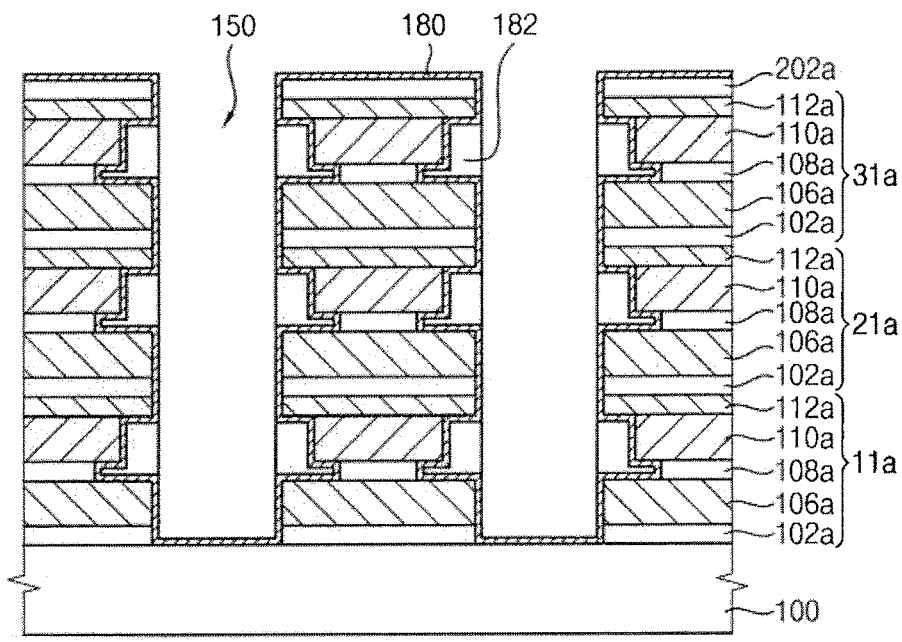

Referring to FIG. 16, a heating electrode layer 180 may be formed on the sidewalls of the openings 150 and first and second recesses 170 and 172 and upper surfaces of the substrate 100 and the upper capping layer 202a. The heating electrode layer 180 may be formed, for example, of a material substantially the same as the material of the heating electrode layer illustrated in FIG. 7.

In example embodiments, the heating electrode layer 180 may be conformally formed on inner walls of the first and second recesses 170 and 172. In some example embodiments, the heating electrode layer 180 may fill the first recess 170.

An insulation layer may be formed on the heating electrode layer 180 to fill the first and second recesses 170 and 172. The insulation layer includes for example, silicon oxide, and may be formed, for example, by a CVD process or an ALD process. The insulation layer may be etched so that the insulation layer may only remain in the first recess 170 to form a first insulation pattern 182. The etching process may include, e.g., a wet etching process or an isotropic dry etching process.

Figure 17:
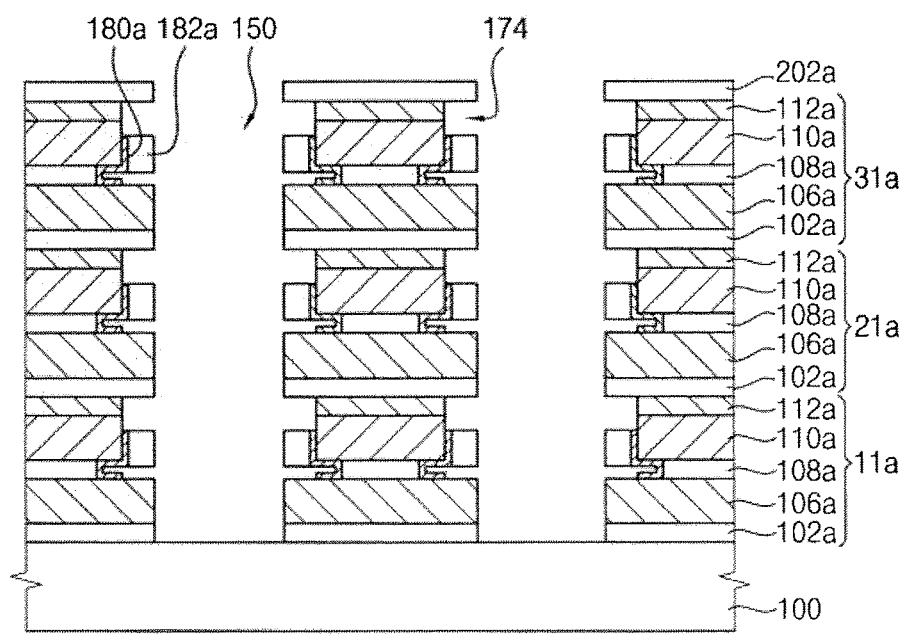

Referring to FIG. 17, the heating electrode layer 180 on the sidewall of the opening 150 and the surface of the substrate 100 may be etched to form a heating electrode 180a. The etching process of the heating electrode layer 180 may include, e.g., a wet etching process or an isotropic dry etching process.

The heating electrode 180a may be conformally formed on the sidewall of the second buffer layer 108a, the bottom of the variable resistance layer 110a, and the upper surface of the selection layer 106a in the first recess 170. In example embodiments, the heating electrode 180a may be also formed on a lower sidewall of the variable resistance layer 110a.

During etching the heating electrode layer 180, the upper electrode layer 112a exposed by the opening 150 may be partially etched to form a third recess 174. In example embodiments, the third recess 174 may have a third width in the horizontal direction equal to or less than the second width.

Figure 18:
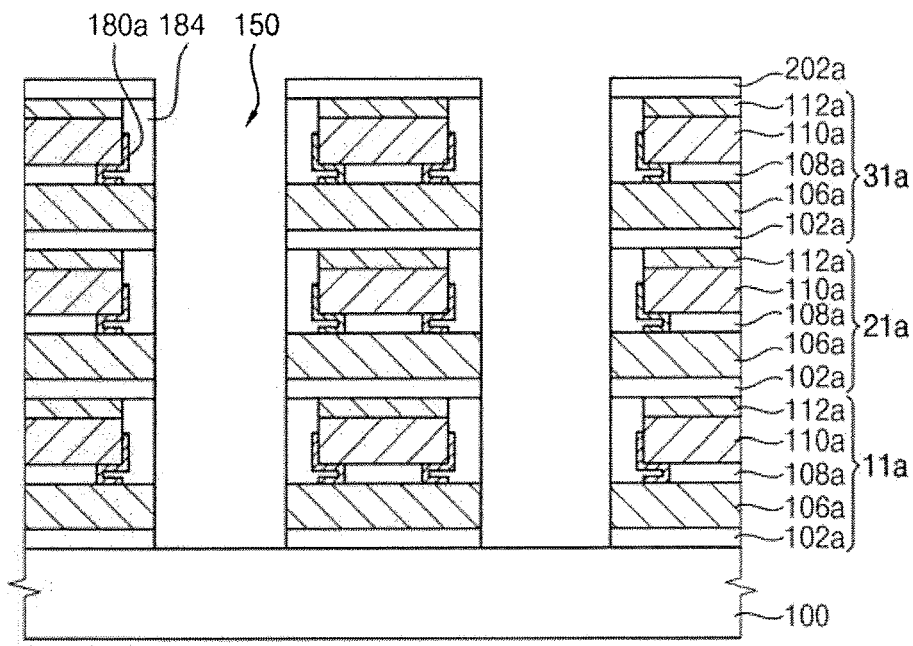
Figure 19:
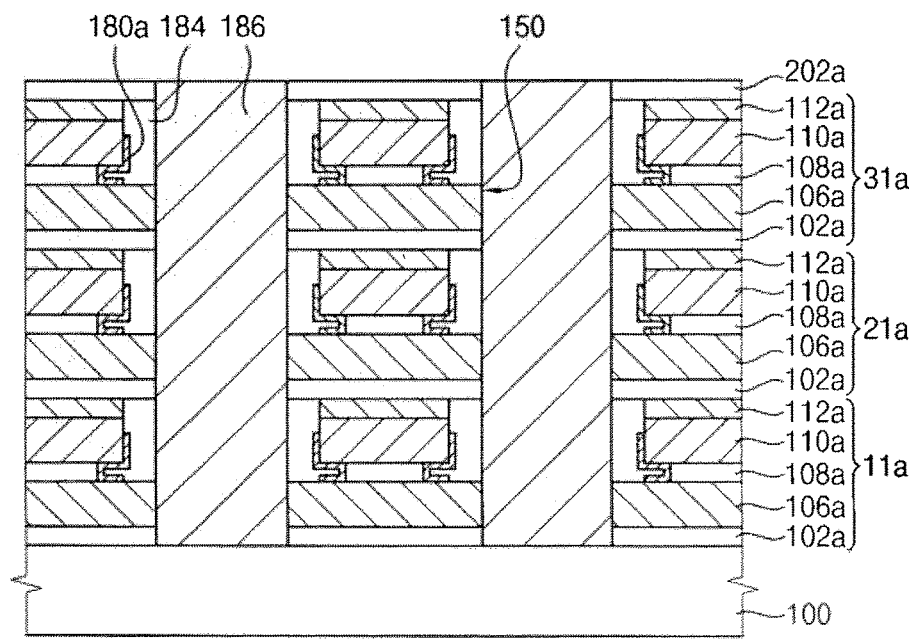

Referring to FIG. 18, an insulation layer may be formed on the sidewall of the opening 150 and the surfaces of the substrate 100 and the upper capping layers 202a to fill the first, second and third recesses 170, 172 and 174. The insulation layer may be etched so that the insulation layer only remains in the first, second, and third recesses 170, 172, and 174 to form a second insulation pattern. The second insulation pattern may include, e.g., silicon oxide.

The first and second insulation patterns may be merged into one insulation pattern 184. The etching process of the insulation layer may include, e.g., a wet etching process or an isotropic dry etching process.

Thus, the capping layer 102a, the selection layer 106a, and the insulation pattern 184 may be exposed by the sidewall of the opening 150. The insulation pattern 184 may cover the sidewalls of the heating electrode 180a, the variable resistance layer 110a, and the upper electrode layer 112a Referring to FIG. 19, a conductive layer may be formed on the capping layer 102a, the selection layer 106a, the insulation pattern 184, the substrate 100, and the upper capping layer 202a to sufficiently fill the opening 150. The conductive layer may be planarized until the upper surface of the upper capping layer 202*a* is exposed to form a contact plug 186 filling the opening 150. The contact plug 186 may directly contact the selection layer 106*a* and may be electrically isolated with the heating electrode 180*a*, the variable resistance layer 110*a*, and the upper electrode layer 112*a*.

Figure 20:
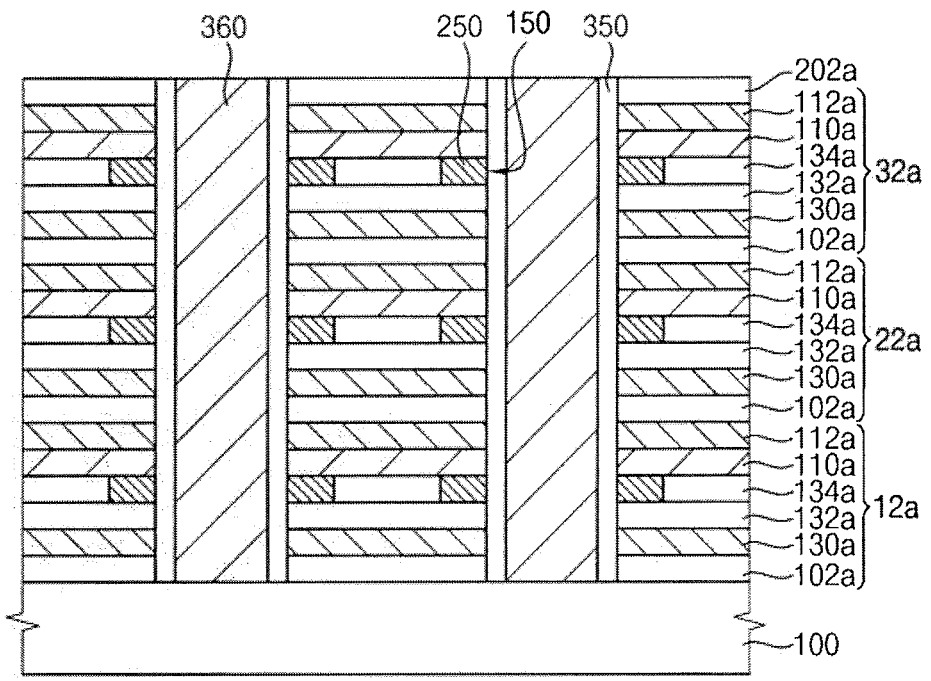
FIGS. 20 and 21 illustrate another embodiment of a variable resistance memory device.
Figure 21:
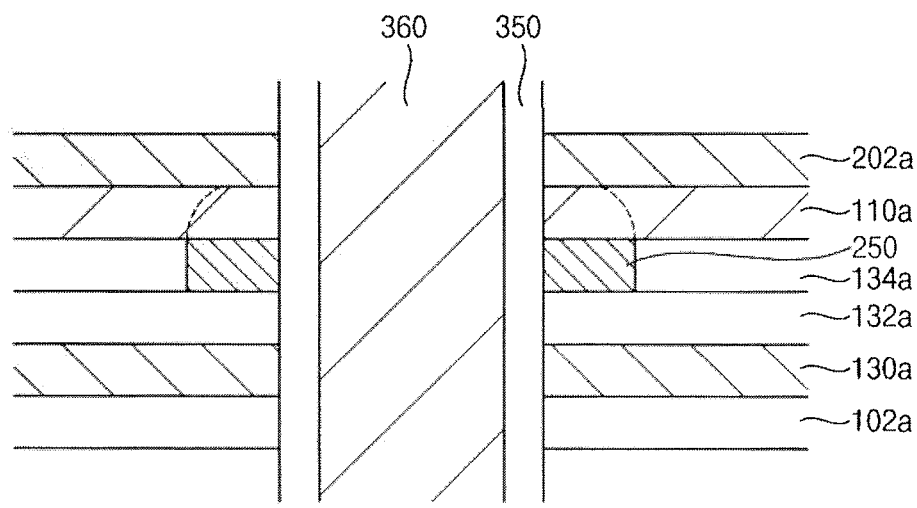
Figure 22:
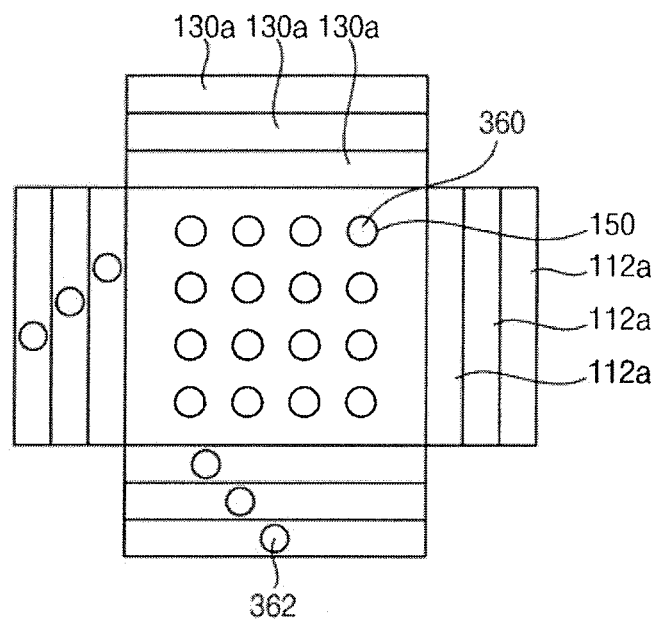
FIG. 22 illustrates another embodiment of a variable resistance memory device.

FIGS. 20 and 21 are cross-sectional views illustrating another embodiment of a variable resistance memory device. FIG. 22 illustrates an embodiment of a plan view of the variable resistance memory device.

Referring to FIGS. 20 and 21, the variable resistance memory device may include stacked cell structures 12*a*, 22*a*, and 32*a* on the substrate 100. Each of the cell structures 12*a*, 22*a*, and 32*a* may include the capping layer 102*a*, a lower electrode layer 130*a*, a channel layer 132*a*, a buffer layer 134*a*, the variable resistance layer 110*a*, and the upper electrode layer 112*a* sequentially stacked. The cell structures 12*a*, 22*a*, and 32*a* may be stacked in the first direction. The number of stacked cell structures may vary among different embodiments.

The capping layer 102*a* may include, e.g., silicon nitride.

The lower electrode layer 130*a* may include, for example, a metal nitride or a metal silicon nitride. In example embodiments, the lower electrode layer 130*a* may include, e.g., titanium nitride ($TiN_x$), titanium silicon nitride ($TiSiN_x$), tungsten nitride ($WN_x$), tungsten silicon nitride ($WSiN_x$), tantalum nitride ($TaN_x$), tantalum silicon nitride ($TaSiN_x$), zirconium nitride ($ZrN_x$), zirconium silicon nitride ($ZrSiN_x$), titanium aluminum nitride, etc.

The channel layer 132*a* may include, e.g., polysilicon.

The buffer layer 134*a* may include an insulation material having a predetermined high etching selectivity with respect to each of the capping layer 102*a* and the channel layer 132*a*. The buffer layer 134*a* may include, e.g., silicon oxide, SiC, SiOC, etc.

The variable resistance layer 110*a* and the upper electrode layer 112*a* may include materials substantially the same as materials of the variable resistance layer and the upper electrode layer, respectively, illustrated in FIGS. 1 to 3.

The stacked cell structures 12*a*, 22*a*, and 32*a* may include the opening 150 therethrough. The opening 150 may expose an upper surface of the substrate 100. A plurality of openings 150 may be spaced apart in regular or predetermined intervals.

A first recess may be formed between the opening 150 and a sidewall of the buffer layer 134*a* adjacent to the opening 150. A heating electrode 250 may be formed on the sidewall of the buffer layer 134*a* to fill the first recess. The heating electrode 250 may be between the channel layer 132*a* and the variable resistance layer 110*a*, so that the channel layer 132*a* and the variable resistance layer 110*a* may be connected with each other by the heating electrode 250. The heating electrode 250 may include a material substantially the same as the material of the heating electrode in FIGS. 1 to 3.

A gate insulation layer 350 may be formed on a sidewall of the opening 150. For example, the gate insulation layer 350 may contact the capping layer 102*a*, the lower electrode layer 130*a*, the channel layer 132*a*, the heating electrode 250, the variable resistance layer 110*a*, and the upper electrode layer 112*a* exposed by the opening 150. In example embodiments, the gate insulation layer 350 may include, e.g., silicon oxide. In some example embodiments, the gate insulation layer 350 may include a metal oxide having a dielectric constant higher than silicon oxide.

A gate electrode 360 may be formed on the gate insulation layer 350 to sufficiently fill the opening 150. The gate electrode 360 may have a pillar shape or another shape. The gate electrode 360 may be formed through the channel layer 132*a*, so that a transistor including the channel layer 132*a*, the gate insulation layer 350, and the gate electrode 360 may be formed at each level. The gate electrode 360 may serve as a common gate of the transistors and may include a metal, e.g., tungsten, aluminum, copper, or another material.

A first wiring electrically connected with the lower electrode layer 130*a* and a second wiring electrically connected with the upper electrode layer 112*a* may be further formed. Thus, electrical signals may be independently applied to the lower electrode layer 130*a* and the upper electrode layer 112*a* formed at each level.

In example embodiments, edge portions of a plurality of lower electrode layers 130*a* may have a staircase shape. Contact plugs 362 and conductive patterns may be formed on the edge portions of the lower electrode layers 130*a*. Also, edge portions of a plurality of the upper electrode layers 112*a* may have a staircase shape. The contact plugs 362 and the conductive patterns may be formed on the edge portions of the upper electrode layers 112*a*.

In operation, first, an electrical signal is applied to a gate electrode 360 in a selected cell structure to turn on a transistor corresponding to the selected cell structure. When an electrical signal is applied to a lower electrode layer 130*a* in the selected cell structure, currents may flow to a heating electrode 250 through the turned-on transistor. Thus, a portion of a variable resistance layer 110*a* may be heated by the heating electrode 250. Currents may flow through an upper electrode layer 112*a* on the variable resistance layer 110*a*.

Thus, the cell structure formed at each level adjacent to the gate electrode 360 may serve as a memory cell. A highly integrated memory device may therefore be achieved through the vertically stacked arrangement of the memory cells.

Figure 23:
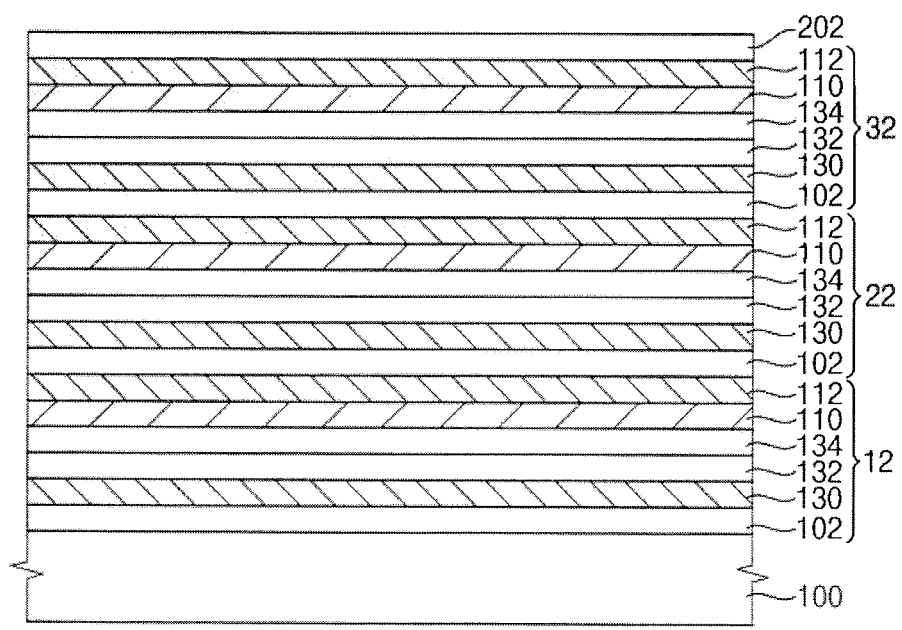
FIGS. 23 and 24 illustrate stages of another embodiment of a method for manufacturing a variable resistance memory device.
Figure 24:
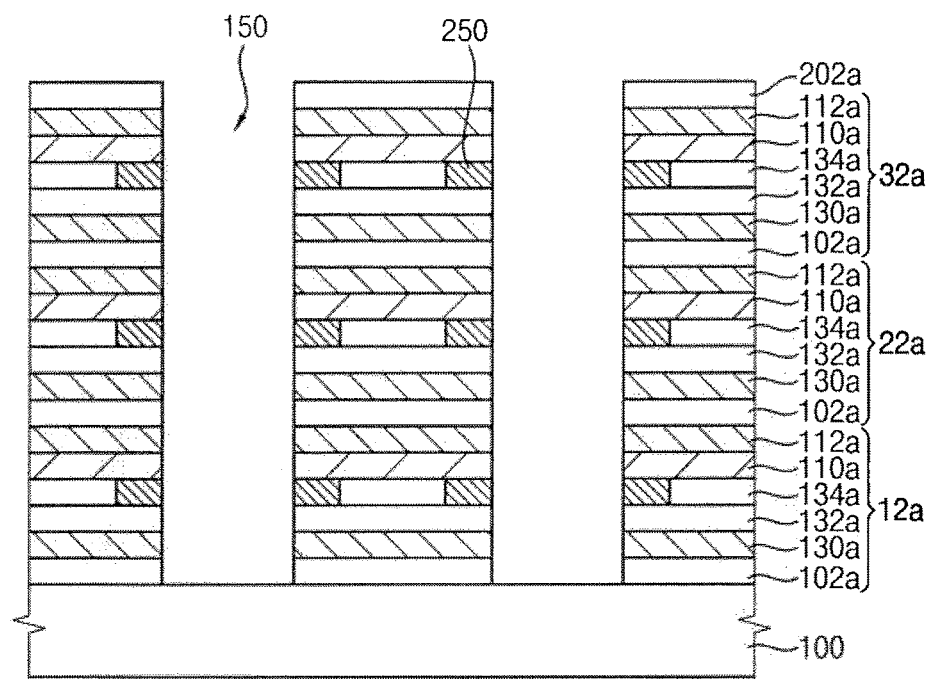

FIGS. 23 to 24 illustrate stages of an embodiment of a method for manufacturing a variable resistance memory device, which, for example, may be the variable resistance memory device shown in FIGS. 20 to 22.

Referring to FIG. 23, the preliminary capping layer 102, a preliminary lower electrode layer 130, a preliminary channel layer 132, a preliminary buffer layer 134, the variable resistance layer 110, and the preliminary upper electrode layer 112 may be sequentially stacked on the substrate 100 to form a preliminary structure 12. The preliminary capping layer 102, the preliminary lower electrode layer 130, the preliminary channel layer 132, the preliminary buffer layer 134, the variable resistance layer 110, and the preliminary upper electrode layer 112 may be sequentially and repeatedly stacked on the preliminary structure 12 to form stacked preliminary structures 12, 22, and 32. The preliminary upper capping layer 202 may be formed on the uppermost preliminary structure 32.

The preliminary capping layer 102, the variable resistance layer 110, and the preliminary upper electrode layer 112 may include materials substantially the same as materials of the preliminary capping layer, the variable resistance layer, and the preliminary upper electrode layer, respectively, illustrated in FIG. 4. The preliminary lower electrode layer 130, the preliminary buffer layer 134, and the preliminary channel layer 132 may include materials substantially the same as materials of the lower electrode layer, the buffer layer, and the channel layer, respectively, in FIGS. 20 to 22.

Referring to FIG. 24, the preliminary upper capping layer 202 and the stacked preliminary structures 12, 22 and 32 may be anisotropically etched to form a plurality of openings 150 therethrough. Each of the openings 150 may expose an upper surface of the substrate 100. The etching process may include, for example, a dry etching process.

The preliminary buffer layer 134 exposed by the sidewalls of the openings 150 may be partially and isotropically etched to form a first recess. The etching process may include, e.g., a wet etching process or an isotropic dry etching process.

Thus, a cell structure including the capping layer 102*a*, a lower electrode layer 130*a*, a channel layer 132*a*, a buffer layer 134*a*, the variable resistance layer 110*a*, and the upper electrode layer 112*a* sequentially stacked may be formed on the substrate 100.

A heating electrode layer may be formed on sidewalls of the opening 150 and the first recess and upper surfaces of the substrate 100 and the upper capping layer 112*a*. The heating electrode layer may include a material substantially the same as the material of the heating electrode layer illustrated in FIG. 7. The heating electrode layer may be etched so that the heating electrode layer remains only in the first recess to form a heating electrode 250. The etching process may include, e.g., a wet etching process or an isotropic dry etching process.

Referring again to FIGS. 20 to 22, a gate insulation layer 350 may be formed on the sidewall of the opening 150 and the upper surface of the upper capping layer 202*a*. A gate electrode layer may be formed on the gate insulation layer to fill the opening 150. The gate electrode layer may be planarized until the upper surface of the upper capping layer 202*a* may be exposed to form a gate electrode 360. The planarization process may include, for example, a CMP process or an etched back process.

Figure 25:
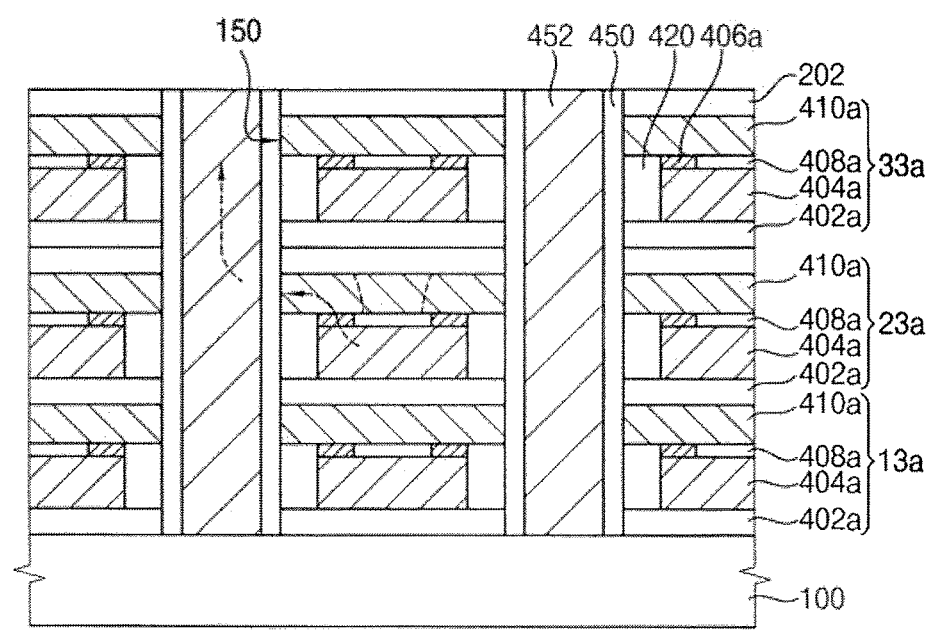
FIG. 25 illustrates another embodiment of a variable resistance memory device.

FIG. 25 illustrates a cross-sectional view of another embodiment of a variable resistance memory device. Referring to FIG. 25, the variable resistance memory device may include a cell structure 13*a* on the substrate 100. The cell structure 13*a* may include a capping layer 402*a*, a lower electrode layer 404*a*, a first insulation layer 408*a*, and a variable resistance layer 410*a* sequentially stacked. A plurality of cell structures 13*a*, 23*a* and 33*a* may be stacked in the first direction. The number of stacked cell structures 13*a*, 23*a*, and 33*a* may vary in different embodiments. The upper capping layer 202*a* may be formed on the uppermost cell structure 33*a*.

The capping layer 402*a* and variable resistance layer 410*a* may include, for example, materials substantially the same as the materials of the capping layer and the variable resistance layer, respectively, illustrated in FIGS. 1 to 3. The lower electrode layer 404*a* may include, for example, a material substantially the same as the material of the lower electrode layer illustrated in FIGS. 20 to 22.

The upper capping layer 202*a* and the cell structures 13*a*, 23*a* and 33*a* may include a plurality of openings 150 therethrough. Each of the openings 150 may expose an upper surface of the substrate 100. A first recess may be formed between the opening 150 and a sidewall of the first insulation layer 408*a* adjacent to the opening 150. A heating electrode 406*a* may be formed in the first recess. The heating electrode 406*a* may be spaced apart from the opening 150 and may surround the opening 150.

A second recess may be formed between the opening 150 and sidewalls of the heating electrode 406*a* and the lower electrode layer 404*a* adjacent to the opening 150. An insulation pattern 420 may be formed in the second recess. The insulation pattern 420 may be formed on the sidewalls of the heating electrode 406*a* and the lower electrode layer 404*a*.

The first insulation layer 408*a* and the insulation pattern 420 may include, e.g., silicon oxide.

A selective pattern 450 may be formed on a sidewall of the opening 150 and may have a cylindrical shape or another shape. The selective pattern 450 may include, for example, a material substantially the same as the material of the lower electrode layer illustrated in FIGS. 1 to 3.

A contact plug 452 may be formed on the selective pattern 450 to sufficiently fill the opening 150. The contact plug 452 may serve as an upper electrode.

In operation, first, an electrical signal may be applied to a lower electrode layer 404*a* in a selective cell structure. Also, currents may flow to a heating electrode 406*a* via the lower electrode layer 404*a*. Thus, a portion of a variable resistance layer 410*a* may be heated by the heating electrode 406*a*, so that currents may flow through the variable resistance layer 410*a*. The selective pattern 450 may be selected, so that currents may flow through the selective pattern 450 and the contact plug 452.

Figure 26:
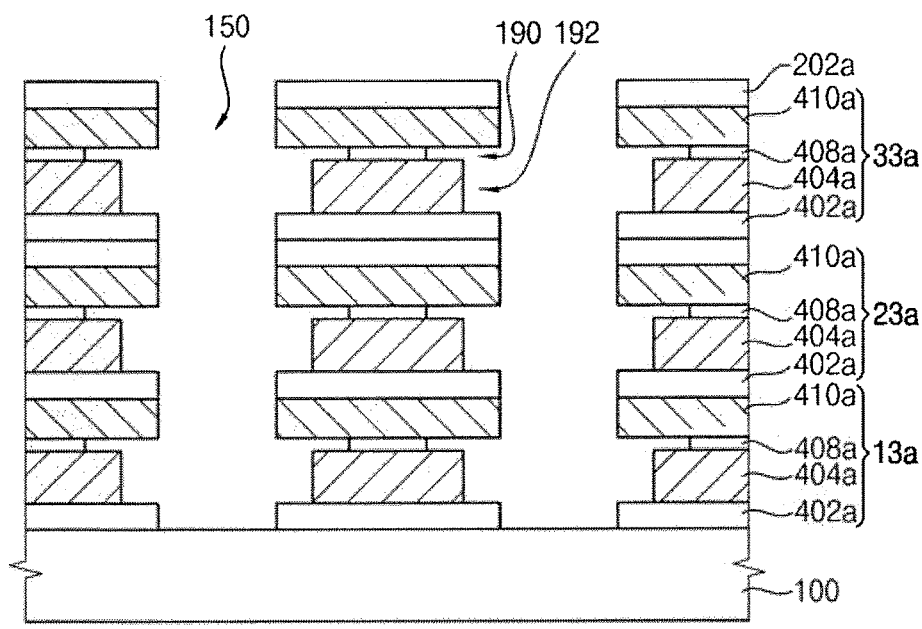
FIGS. 26 and 27 illustrate stages of another embodiment of a method for manufacturing a variable resistance memory device.
Figure 27:
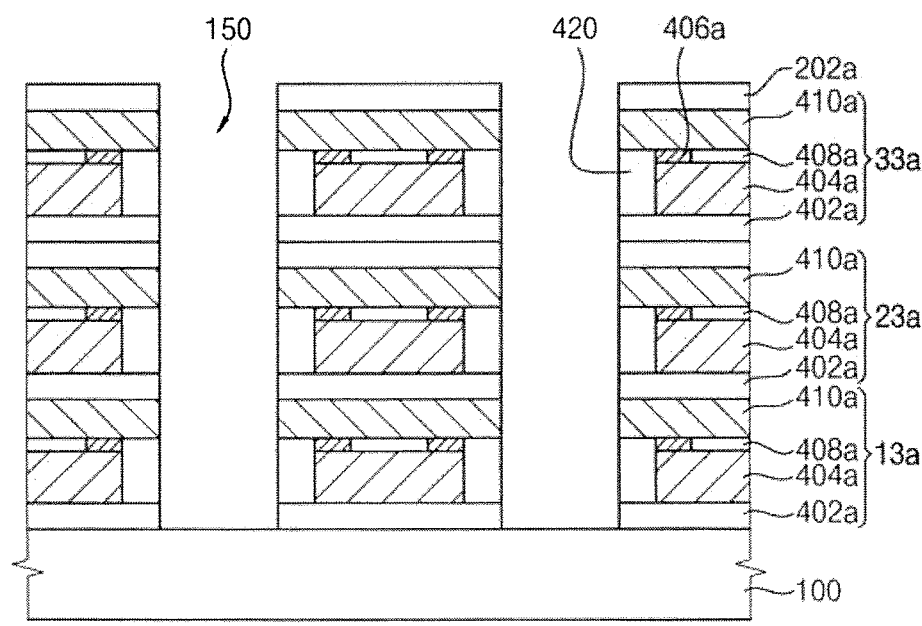

FIGS. 26 and 27 are cross-sectional views illustrating stages of another embodiment of a method for manufacturing the variable resistance memory device, which, for example, may be the variable resistance memory device in FIG. 25.

Referring to FIG. 26, a preliminary capping layer, a preliminary lower electrode layer, a preliminary first insulation layer, and a preliminary variable resistance layer may be sequentially stacked on the substrate 100 to form a preliminary structure. The preliminary capping layer, the preliminary lower electrode layer, the preliminary selection layer, the preliminary second buffer layer, the preliminary first insulation layer, and the preliminary variable resistance layer may be sequentially and repeatedly stacked on the preliminary structure to form stacked preliminary structures. A preliminary upper capping layer may be formed on an uppermost preliminary structure.

The preliminary upper capping layer and the stacked preliminary structures may be anisotropically etched to form a plurality of openings 150 therethrough. Each of the openings may expose an upper surface of the substrate 100.

The preliminary first insulation layer and the preliminary lower electrode layer exposed by sidewalls of the openings 150 may be partially and isotropically etched to form first and second recesses 190 and 192. The first recess 190 may be formed by partially etching the preliminary first insulation layer. The second recess 192 may be formed by partially etching the preliminary lower electrode layer. In example embodiments, during the isotropic etching process, the preliminary first insulation layer may be etched more quickly than the preliminary lower electrode layer. In some example embodiments, the first recess 190 and the second recess 192 may be formed by different isotropic etching processes.

Thus, the first recess 190 may have a first width in the horizontal direction, and the second recess 192 may have a second width in the horizontal direction less than the first width. The etching process of the preliminary first insulation layer and the preliminary lower electrode layer may include a wet etching process or an isotropic dry etching process.

Thus, the preliminary capping layer, the preliminary lower electrode layer, the preliminary first insulation layer, and the preliminary variable resistance layer may be transformed into a capping layer, a lower electrode layer, a first insulation layer, and a variable resistance layer, respectively, having the openings 150 therethrough and the first and second recesses 190 and 192.

Referring to FIG. 27, a heating electrode layer may be formed on sidewalls of the opening 150 and the first and second recesses 190 and 192 and upper surfaces of the substrate 100 and the upper capping layer 202a. The heating electrode layer may be formed, for example, of a material substantially the same as materials of the heating electrode layer illustrated in FIG. 7. In example embodiments, the heating electrode layer may partially fill the first recess 190. The heating electrode layer may be etched so that the heating electrode layer may remain only in the first recess 190 to form a heating electrode 406a.

An insulation layer may be formed on the sidewalls of the opening 150, the second recess 192 and the heating electrode 406a and the upper surface of the substrate 100 and the upper capping layer 202a. The insulation layer may be formed of, e.g., silicon oxide. In example embodiments, the insulation layer may fill second recess 192.

The insulation layer may be etched so that the insulation layer may remain in the second recess 192 to form an insulation pattern 420. The insulation pattern 420 may cover the sidewalls of the lower electrode layer 404a and the heating electrode 406a.

Referring again to FIG. 25, a selection layer may be formed on the sidewall of the opening 150 and the upper surfaces of the substrate 100 and the upper capping layer 202a. The selection layer may be isotropically etched to form a selective pattern 450 on the sidewall of the opening 150. A contact plug 452 may be formed on the selective pattern 450 to sufficiently fill the opening 150.

Figure 28:
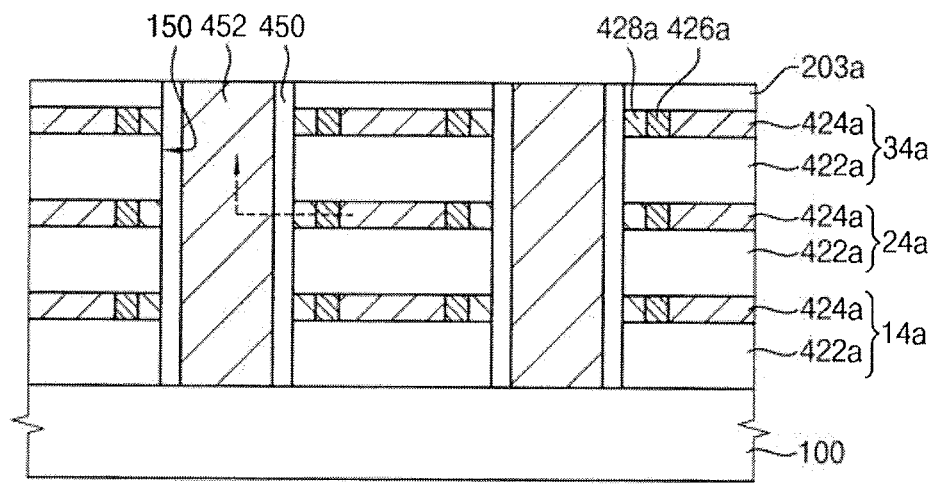
FIG. 28 illustrates another embodiment of a variable resistance memory device.

FIG. 28 is a cross-sectional view illustrating another embodiment of a variable resistance memory device. Referring to FIG. 28, the variable resistance memory device may include a cell structure 14a on the substrate 100. The cell structure 14a may include a plurality of insulation layers 422a and a plurality of lower electrode layers 424a that are sequentially and alternately stacked. A plurality of cell structures 14a, 24a, and 34a may be stacked in the first direction. An upper capping layer 202a may be formed on the uppermost cell structure 34a.

The insulation layer 422a may include, e.g., silicon oxide or silicon nitride.

The upper capping layer 202a and the cell structures 14a, 24a, and 34a may include a plurality of openings 150. Each of the openings 150 may expose an upper surface of the substrate 100. A first recess may be formed between the opening 150 and a sidewall of the lower electrode layer 424a adjacent to the opening 150. A heating electrode 426a and a variable resistance pattern 428a may be stacked in the horizontal direction to fill the first recess. Thus, the heating electrode 426a and the variable resistance pattern 428a may surround the opening 150. The heating electrode 426a may contact the lower electrode layer 424a, and the variable resistance pattern 428a may be exposed by the opening 150.

A selective pattern 450 may be formed on a sidewall of the opening 150 and may have a cylindrical shape or another shape.

A contact plug 452 may be formed on the selective pattern 450 to sufficiently fill the opening 150. The contact plug 452 may serve as an upper electrode.

In operation, first, an electrical signal may be applied to a lower electrode layer 424a in a selective cell structure for operation. Also, currents may flow to a heating electrode 406a via the lower electrode layer 424a. Thus, a variable resistance layer 410a may be heated by the heating electrode 406a, so that current may flow through the variable resistance layer 410a. The selective pattern 450 may be selected, so that currents may flow through the selective pattern 450 and the contact plug 452.

Figure 29:
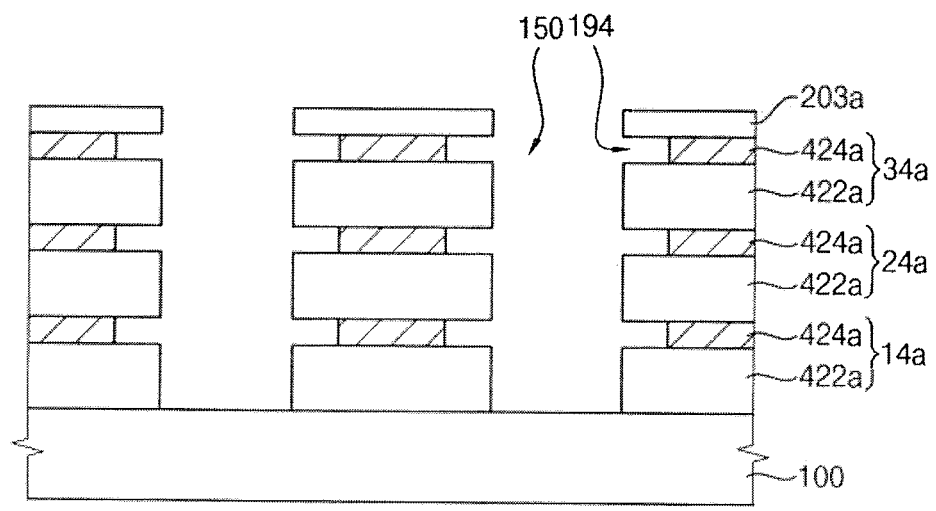
FIGS. 29 and 30 illustrate stages of another embodiment of a method for manufacturing a variable resistance memory device.
Figure 30:
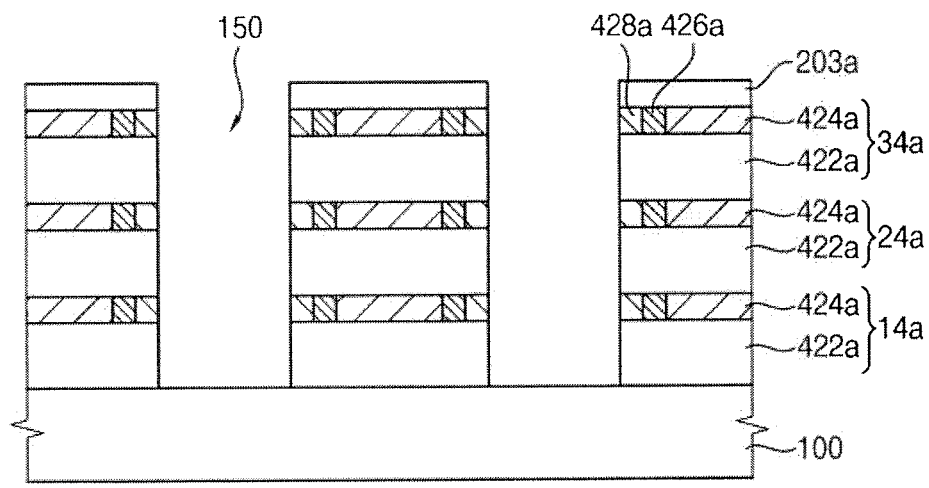

FIGS. 29 and 30 are cross-sectional views illustrating stages of another embodiment of a method of manufacturing a variable resistance memory device, which, for example, may be the variable resistance memory device shown in FIG. 28.

Referring to FIG. 29, a preliminary insulation layer and a preliminary lower electrode layer may be sequentially stacked on the substrate 100 to form a preliminary structure. The preliminary insulation layer and the preliminary lower electrode layer may be sequentially and repeatedly stacked on the preliminary structure to form stacked preliminary structures. A preliminary upper capping layer may be formed on an uppermost preliminary structure. The preliminary upper capping layer and the stacked preliminary structures may be anisotropically etched to form an opening 150 therethrough. The opening 150 may expose an upper surface of the substrate 100. The preliminary lower electrode layer exposed by a sidewall of the opening 150 may be partially and isotropically etched to form a recess 194.

Thus, stacked cell structures including an insulation layer 422a and a lower electrode layer 424a sequentially stacked may be formed on the substrate 100.

Referring to FIG. 30, a heating electrode layer may be formed on sidewalls of the opening 150 and the recess 194 and upper surfaces of the substrate 100 and the upper insulation layer 203a. The heating electrode layer may be formed, for example, of a material substantially the same as materials of the heating electrode layer in FIG. 7. In example embodiments, the heating electrode layer may partially fill recess 194.

The heating electrode layer may be partially etched to form a heating electrode 426a. The heating electrode 426a may partially fill the recess 194.

A variable resistance layer may be formed on the sidewall of the opening 150 and the heating electrode 426a and surfaces of the substrate 100 and the upper insulation layer 203a. The variable resistance layer may be etched so that the variable resistance layer may remain only in the recess 194 to form a variable resistance pattern 428a on the heating electrode 426a.

Referring again to FIG. 28, a selection layer may be formed on the sidewall of the opening 150 and upper surfaces of the substrate 100 and the upper insulation layer 203a. The selection layer may be isotropically etched to form a selective pattern 450 on the sidewalls of the opening 150. A contact plug 452 may be formed on the selective pattern 450 to sufficiently fill the opening 150.

Figure 31:
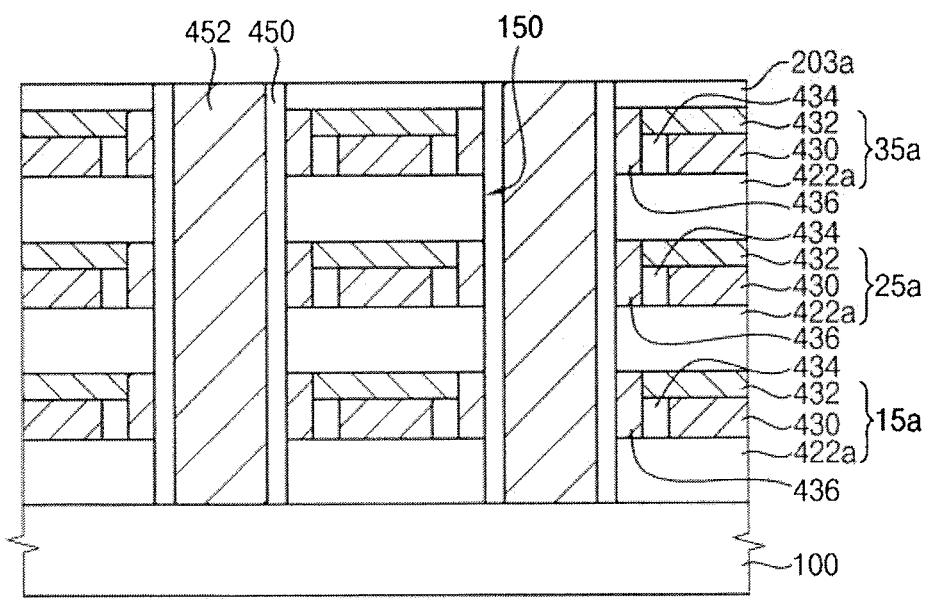
FIG. 31 illustrates another embodiment of a variable resistance memory device.

FIG. 31 illustrates another embodiment of a variable resistance memory device which may include a cell structure 15a on the substrate 100. The cell structure 15a may include the insulation layer 422a, a lower electrode layer 430, and a heating electrode layer 432 sequentially stacked. A plurality of cell structures 15a, 25a and 35a may be stacked in the first direction. The number of stacked cell structures 15a, 25a and 35a may vary in different embodiments.

The upper insulation layer 203a may be on an uppermost cell structure. The insulation layer 422a may include, e.g., silicon oxide or silicon nitride. The upper insulation layer 203a and the cell structures 15a, 25a and 35a may include an opening 150 therethrough. The opening 150 may expose an upper surface of the substrate 100.

A first recess may be formed between the opening 150 and a sidewall of the lower electrode layer 430 adjacent to the opening 150. A second recess may be formed between the opening 150 and a sidewall of the heating electrode layer 432 adjacent to the opening 150.

An insulation pattern 434 may be formed in the first recess and may contact a sidewall of the lower electrode layer 430. A variable resistance pattern 436 may be formed on sidewalls of the insulation layer 422a and the heating electrode layer 432 to fill the second recess. Thus, the variable resistance pattern 436 may surround the opening 150. The variable resistance pattern 436 may be exposed by the opening 150.

A selective pattern 450 may be formed on the sidewall of the opening 150 and may have a cylindrical shape or another shape. A contact plug 452 may be formed on the selective pattern 450 to sufficiently fill the opening 150. The contact plug 452 may serve as an upper electrode.

Operation of this embodiment of the variable resistance memory device may be substantially the same as the operation illustrated with reference to FIG. 28.

Figure 32:
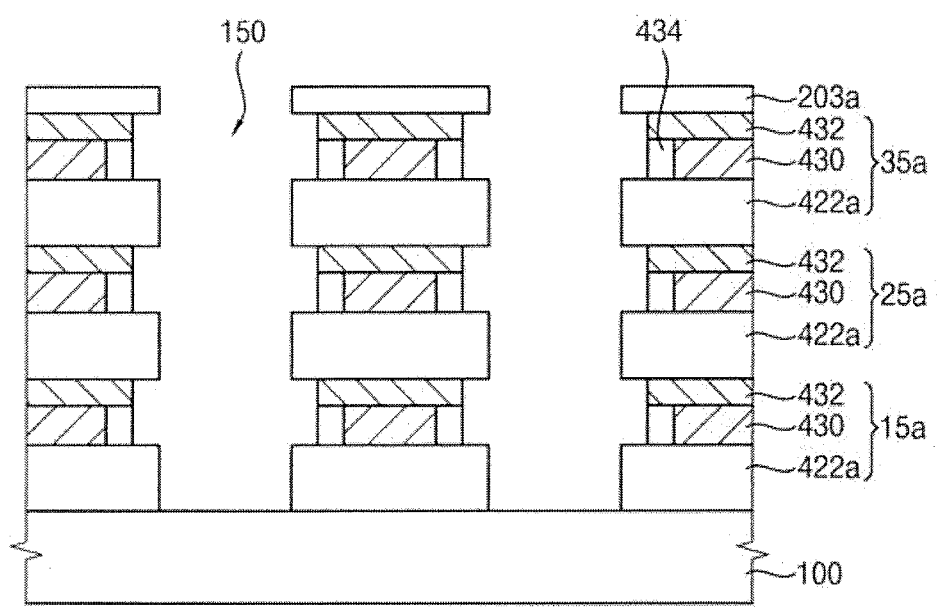
FIG. 32 illustrates stages of another embodiment of a method for manufacturing a variable resistance memory device.

FIG. 32 is a cross-sectional view illustrating stages of another embodiment of a method for manufacturing a variable resistance memory device, which, for example, may be the variable resistance memory device shown in FIG. 31.

Referring to FIG. 32, a preliminary insulation layer, a preliminary lower electrode layer, and preliminary heating layer may be sequentially stacked on the substrate 100 to form a preliminary structure. The preliminary insulation layer, the preliminary lower electrode layer, and the preliminary heating layer may be sequentially and repeatedly stacked on the preliminary structure to form stacked preliminary structures. An upper insulation layer 203a may be formed on the uppermost preliminary structure. The upper insulation layer 203a and the stacked preliminary structures may be anisotropically etched to form an opening 150 therethrough. The opening 150 may expose an upper surface of the substrate 100. The preliminary lower electrode layer and the heating electrode layer exposed by a sidewall of the opening 150 may be partially and isotropically etched to form first and second recesses, respectively.

Thus, stacked cell structures 15a, 25a and 35a including an insulation layer 422a, a lower electrode layer 430, and a heating electrode layer 432 sequentially stacked may be formed on the substrate 100. An insulation layer may be formed on sidewalls of the opening 150 and first and second recesses and upper surfaces of the substrate 100 and the upper insulation layer 203a. The insulation layer may be partially etched to form an insulation pattern 434 on the sidewall of lower electrode layer 430 to partially fill the first recess.

Referring again to FIG. 31, a variable resistance layer may be formed on the insulation layer 422a, the insulation pattern 434, and the heating electrode layer 432 exposed by the opening 150 and the surfaces of the substrate 100 and the upper insulation layer 203a to fill the second recess. The variable resistance layer may be partially etched to form a variable resistance pattern 436 on the sidewalls of the heating electrode layer 432 and the insulation pattern 434 to fill the second recess.

A selection layer may be formed on the sidewall of the opening 150 and the surfaces of the substrate 100 and the upper insulation layer 203a. The selection layer may be anisotropically etched to form a selective pattern 450 on the sidewall of the opening 150. A contact plug 452 may be formed on the selective pattern 450 to sufficiently fill the opening 150.

In accordance with one or more of the aforementioned embodiments, the variable resistance memory device may include a vertically stacked arrangement of memory cells to achieve high integration.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A semiconductor device, comprising:
a stacked structure including a plurality of cell structures stacked on a substrate, each of the plurality of cell structures including a capping layer, a selection layer, a buffer layer, a variable resistance layer, and a upper electrode layer sequentially stacked;
an electrode structure in an opening through the stacked structure, the electrode structure being electrically isolated from the buffer layer, the variable resistance layer, and the upper electrode layer and being electrically connected to the selection layer; and
a heating electrode between the variable resistance layer and the selection layer, the heating electrode to transfer heat to the variable resistance layer.

2. The semiconductor device as claimed in claim 1, wherein each of the selection layer and the variable resistance layer includes a chalcogenide-based material.

3. The semiconductor device as claimed in claim 1, wherein:
the selection layer includes an Ovonic threshold switch (OTS) material, and
the variable resistance layer includes a GST material including germanium (Ge), antimony (Sb), and/or tellurium (Te) in a predetermined ratio.

4. The semiconductor device as claimed in claim 1, wherein the heating electrode directly contacts a portion of a surface of the variable resistance layer.

5. The semiconductor device as claimed in claim 1, wherein:
the heating electrode is on a sidewall of the buffer layer, and
the heating electrode is in a recess between the variable resistance layer and the selection layer.

6. The semiconductor device as claimed in claim 1, further comprising:
an insulation pattern between the electrode structure and each of the variable resistance layer, the upper electrode layer, and the heating electrode exposed by the opening.

7. The semiconductor device as claimed in claim 6, wherein:
the insulation pattern includes an oxide corresponding to oxidized surfaces of the variable resistance layer, the upper electrode layer, and the heating electrode.

8. The semiconductor device as claimed in claim 1, further comprising:
a conductive pattern electrically connecting the selection layer to the electrode structure.

9. The semiconductor device as claimed in claim 1, wherein:
the heating electrode is spaced apart from the electrode structure, and the heating electrode has a ring shape around the electrode structure.

10. The semiconductor device as claimed in claim 1, wherein the heating electrode has a conformal shape corresponding to a sidewall of the buffer layer, an upper surface of the selection layer, and a bottom of the variable resistance layer.

11. The semiconductor device as claimed in claim 1, further comprising:
a lower electrode layer on the capping layer,
wherein the selection layer includes silicon.

12. The semiconductor device as claimed in claim 11, further comprising:
a gate insulation layer between the electrode structure and each of the lower electrode layer, the selection layer, the variable resistance layer, the upper electrode layer, and the heating electrode exposed by the opening.

13. A semiconductor device, comprising:
a stacked structure including a plurality of cell structures stacked on a substrate, each of the plurality of cell structures including an insulation pattern and a lower electrode layer stacked;
a selective pattern on a sidewall of an opening through the stacked structure;
an electrode structure on the selective pattern and filling the opening;
a variable resistance layer between the lower electrode layer and the selective pattern, the variable resistance layer directly contacting the selective pattern; and
a heating electrode between the variable resistance layer and the lower electrode layer, wherein the heating electrode directly contacts a portion of the variable resistance layer.

14. The semiconductor device as claimed in claim 13, wherein the selective pattern has a cylindrical shape.

15. A semiconductor device, comprising:
an electrode structure; and
a plurality of cell structures in a stack,
wherein each of the plurality of cell structures corresponds to a memory cell and includes a selection layer, a variable resistance layer, a heating layer, and an electrode layer, the electrode structure electrically connected to the selection layer and electrically isolated from the variable resistance layer, the heating layer, and the electrode layer, the heating layer to transfer heat to the variable resistance layer, and
wherein each of the selection layer and the variable resistance layer includes a chalcogenide-based material.

16. The semiconductor device as claimed in claim 15, wherein:
the stack includes an opening through the plurality of cell structures, and
the electrode structure is in the opening.

17. The semiconductor device as claimed in claim 15, wherein the stack includes four or more levels cell structures of the plurality of cell structures.

18. The semiconductor device as claimed in claim 15, wherein:
the selection layer includes an Ovonic threshold switch (OTS) material, and
the variable resistance layer includes a GST material including germanium (Ge), antimony (Sb), and/or tellurium (Te) in a predetermined ratio.

19. The semiconductor device as claimed in claim 8, wherein the heating electrode has a resistance greater than a resistance of the conductive pattern.

* * * * *